United States Patent
Tian et al.

(10) Patent No.: US 10,348,119 B2
(45) Date of Patent: Jul. 9, 2019

(54) ADAPTER AND METHOD FOR CHARGING CONTROL

(71) Applicant: Guangdong Oppo Mobile Telecommunications Corp., Ltd., Dongguan, Guangdong (CN)

(72) Inventors: Chen Tian, Guangdong (CN); Jialiang Zhang, Guangdong (CN)

(73) Assignee: Guangdong Oppo Mobile Telecommunications Corp., Ltd., Dongguan (CN)

(*) Notice: Subject to any disclaimer, the term of this patent is extended or adjusted under 35 U.S.C. 154(b) by 24 days.

(21) Appl. No.: 15/573,853

(22) PCT Filed: Jan. 7, 2017

(86) PCT No.: PCT/CN2017/070526
§ 371 (c)(1),
(2) Date: Nov. 14, 2017

(87) PCT Pub. No.: WO2017/133386
PCT Pub. Date: Aug. 10, 2017

(65) Prior Publication Data
US 2018/0262042 A1    Sep. 13, 2018

(30) Foreign Application Priority Data

Feb. 5, 2016  (WO) ............... PCT/CN2016/073679
Jul. 26, 2016  (CN) ........................ 2016 1 0600612

(51) Int. Cl.
*H02J 7/04* (2006.01)
*H02J 7/02* (2016.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC ........ H02J 7/14; H02J 7/0068; H01M 10/441; H01M 10/44
(Continued)

(56) References Cited

U.S. PATENT DOCUMENTS 4,087,733 A    5/1978  Casagrande
6,137,265 A    10/2000 Cummings et al.
(Continued)

FOREIGN PATENT DOCUMENTS

CN    1564421 A    1/2005
CN    1897394 A    1/2007
(Continued)

OTHER PUBLICATIONS

Extended European search report issued in corresponding European application No. 17746706.5 dated May 2, 2018.
(Continued)

*Primary Examiner* — Arun C Williams
(74) *Attorney, Agent, or Firm* — Young Basile Hanlon & MacFarlane, P.C.

(57) ABSTRACT

An adapter for charging control includes a power converting unit, a voltage feedback unit, a current feedback unit, and a power adjusting unit. The power adjusting unit includes an input end coupled to an output end of the voltage feedback unit to an output end of the current feedback unit, and an output end coupled to the power converting unit. The power adjusting unit is used to receive the voltage feedback signal and the current feedback signal, and stabilize the output voltage and output current of the second adapter when the voltage feedback signal indicates that the output voltage of the second adapter has reached the target voltage, or the current feedback signal indicates the output current of the second adapter has reached the target current.

22 Claims, 14 Drawing Sheets

(51) Int. Cl.

| | |
|---|---|
| *G01R 31/3842* | (2019.01) |
| *H02M 3/335* | (2006.01) |
| *H02J 7/00* | (2006.01) |
| *H02M 7/217* | (2006.01) |
| *H02J 7/06* | (2006.01) |
| *H02M 1/08* | (2006.01) |
| *H02M 7/06* | (2006.01) |
| *H01M 10/0525* | (2010.01) |
| *H01M 10/42* | (2006.01) |
| *H01M 10/44* | (2006.01) |
| *H02M 1/44* | (2007.01) |
| *H02M 5/04* | (2006.01) |
| *H02M 7/04* | (2006.01) |
| *H02M 1/00* | (2006.01) |
| *H02J 7/10* | (2006.01) |

(52) U.S. Cl.
CPC ......... *H01M 10/425* (2013.01); *H01M 10/44* (2013.01); *H02J 7/007* (2013.01); *H02J 7/008* (2013.01); *H02J 7/0029* (2013.01); *H02J 7/0031* (2013.01); *H02J 7/0052* (2013.01); *H02J 7/0093* (2013.01); *H02J 7/022* (2013.01); *H02J 7/04* (2013.01); *H02J 7/041* (2013.01); *H02J 7/045* (2013.01); *H02J 7/047* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 2010/4271* (2013.01); *H02J 2007/0039* (2013.01); *H02J 2007/0059* (2013.01); *H02J 2007/0062* (2013.01); *H02J 2007/0096* (2013.01); *H02J 2007/0098* (2013.01); *H02J 2007/10* (2013.01); *H02M 2001/0009* (2013.01)

(58) Field of Classification Search
USPC ........................................................ 320/162
See application file for complete search history.

(56) References Cited

U.S. PATENT DOCUMENTS

| | | | |
|---|---|---|---|
| 2004/0090209 A1 | 5/2004 | Nishida et al. | |
| 2004/0164714 A1 | 8/2004 | Hayashi | |
| 2006/0284595 A1* | 12/2006 | Hsieh | H02J 7/0077 320/115 |
| 2008/0169705 A1* | 7/2008 | Tan | H01M 10/44 307/66 |
| 2008/0197811 A1* | 8/2008 | Hartular | H01M 10/44 320/141 |
| 2013/0141034 A1 | 6/2013 | Huang et al. | |
| 2017/0040810 A1 | 2/2017 | Hu et al. | |

FOREIGN PATENT DOCUMENTS

| | | |
|---|---|---|
| CN | 101202462 A | 6/2008 |
| CN | 202026118 U | 11/2011 |
| CN | 102801340 A | 11/2012 |
| CN | 103001272 A | 3/2013 |
| CN | 103066666 A | 4/2013 |
| CN | 203135543 U | 8/2013 |
| CN | 103795040 A | 5/2014 |
| CN | 203645386 U | 6/2014 |
| CN | 203747451 U | 7/2014 |
| CN | 203747485 U | 7/2014 |
| CN | 103178595 B | 6/2015 |
| CN | 102545360 A | 7/2015 |
| CN | 104810877 A | 7/2015 |
| CN | 104810879 A | 7/2015 |
| CN | 104967201 A | 10/2015 |
| CN | 105098900 A | 11/2015 |
| CN | 103762702 B | 12/2015 |
| EP | 2228884 A2 | 9/2010 |
| EP | 2887492 A2 | 6/2015 |
| EP | 2930589 A1 | 10/2015 |
| EP | 2980958 A1 | 2/2016 |
| JP | H05-103430 A | 4/1993 |
| JP | H06-46535 A | 2/1994 |
| JP | 2012223077 A | 11/2012 |
| JP | 2013198262 A | 9/2013 |
| JP | 5454781 B2 | 3/2014 |
| TW | 201014112 A | 4/2010 |
| WO | 2012167677 A1 | 12/2012 |
| WO | 2015113341 A1 | 8/2015 |
| WO | 2015113349 A1 | 8/2015 |

OTHER PUBLICATIONS

Liang-Rui Chen, 'A Design of an Optimal Battery Pulse Charge System by Frequency-Varied Technique', IEEE Transactions on Industrial Electronics, vol. 54, No. 1, Feb. 2007, pp. 398-405.

Office Action 1 issued in corresponding European application No. 17746706.5 dated Jan. 4, 2019.

* cited by examiner

ADAPTER AND METHOD FOR CHARGING CONTROL

CROSS-REFERENCE TO RELATED APPLICATION(S)

This application claims priority to International Application No. PCT/CN2016/073679, filed on Feb. 5, 2016, and Chinese Patent Application No. 201610600612.3, filed on Jul. 26, 2016, the contents of both of which are hereby incorporated by reference in their entireties.

TECHNICAL FIELD

Embodiments of the present disclosure generally relate to charging technology, and more particularly relate to an adapter and a method for charging control.

BACKGROUND

An adapter, also known as a power adapter, is used to charge a device to be charged (e.g., a terminal). An adapter currently available on the market typically provides a constant voltage to charge the device to be charged (e.g., a terminal). When the current drawn by the device to be charged (e.g., a terminal) exceeds the maximum output current threshold the adapter can supply, however, the adapter may be triggered to enter the overload protection state such that the device to be charged (e.g., a terminal) would no longer be charged.

SUMMARY

Embodiments disclosed herein provide an adapter and a method for charging control which can improve the safety of the charging process.

According to a first aspect, an adapter includes: a power converting unit configured to convert an input alternating current (AC) to obtain an output voltage and output current of the adapter; a voltage feedback unit having an input end coupled to the power converting unit to detect the output voltage of the adapter in order to generate a voltage feedback signal that indicates whether the output voltage of the adapter reaches a target voltage; a current feedback unit having an input end coupled to the power converting unit to detect the output current of the adapter in order to generate a current feedback signal indicating whether the output current of the adapter reaches a target current; and a power adjusting unit having an input end coupled to an output end of the voltage feedback unit and to an output end of the current feedback unit, and an output end coupled to the power converting unit. The power adjusting unit may be configured to receive the voltage feedback signal and the current feedback signal and stabilize the output voltage and output current of the adapter when the voltage feedback signal indicates the output voltage of the adapter has reached the target voltage or the current feedback signal indicates the output current of the adapter has reached the target current; a charging interface having a data line configured to be used by the adapter to perform two-way communication with the device to be charged.

According to a second aspect, a method for charging control implemented by an adapter includes: converting an input alternating current (AC) to obtain an output voltage and output current of the adapter; detecting the output voltage of the adapter to generate a voltage feedback signal that indicates whether the output voltage of the adapter reaches a target voltage; detecting the output current of the adapter to generate a current feedback signal indicating whether the output current of the adapter reaches a target current; and stabilizing the output voltage and output current of the adapter when the voltage feedback signal indicates the output voltage of the adapter has reached the target voltage or the current feedback signal indicates the output current of the adapter has reached the target current; performing two-way communication with the device to be charged via the data line in the charging interface.

The adapter according to the embodiments includes both a voltage feedback unit and a current feedback unit. The voltage feedback unit, power adjusting unit, and power converting unit altogether form a hardware circuit that exerts closed-loop control of the adapter's output voltage, i.e., realizing a hardware voltage feedback loop. The current feedback unit, power adjusting unit, and power converting unit altogether form a hardware circuit that exerts closed-loop control over the adapter's output current, i.e., realizing a hardware current feedback loop. Thus relying on the double-loop feedback control, the power adjusting unit may take into account the feedback information provided by both the voltage feedback signal and the current feedback signal, and would commence to stabilize the output voltage and output current of the adapter when either the output voltage or the output current reaches the respective target value. In other words, once either the output voltage or the output current of the adapter reaches the target value, the power adjusting unit can immediately sense the occurrence of this event and accordingly make an instant response to the event so as to stabilize the output voltage and output current, which improves the safety of the charging process.

BRIEF DESCRIPTION OF THE DRAWINGS

To better illustrate the embodiments of the disclosure, a brief description of the accompanying drawings for use with the illustration of the embodiments is provided below. It is evident that the drawings described below depict merely some embodiments and those of ordinary skill in the art can obtain other drawings based on the arrangements illustrated in these drawings without making inventive efforts.

DETAILED DESCRIPTION

Figure 1A:
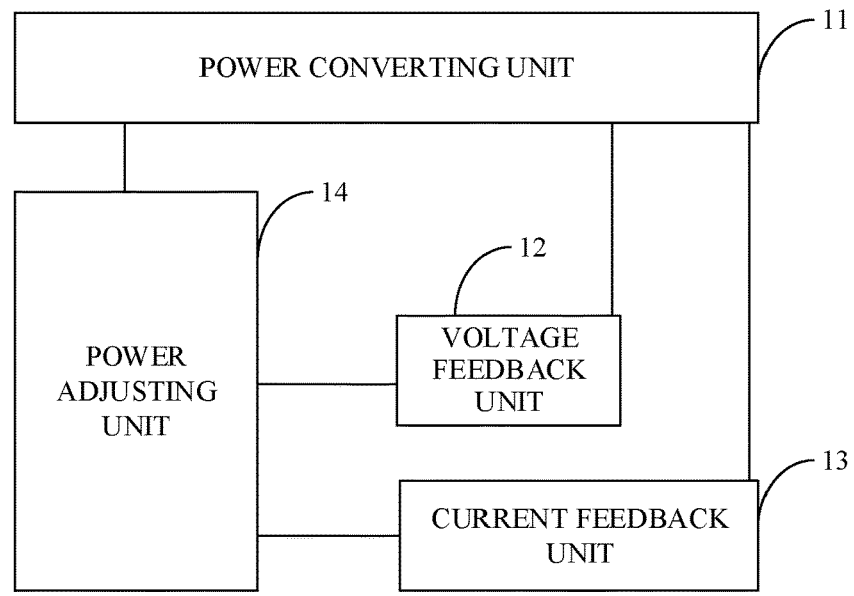
FIG. 1A is a block diagram illustrating a second adapter in accordance with an embodiment.

In the following, embodiments of the disclosure will be described in detail with reference to the accompanying drawings. It is evident that the embodiments described herein constitute merely some rather than all of the embodiments. Therefore, all other embodiments obtained by those of ordinary skill in the art based on embodiments disclosed herein without making inventive efforts shall all fall in the scope of the disclosure.

In the related art is mentioned a first adapter configured to charge a device to be charged, e.g., a terminal. The first adapter typically operates in a constant-voltage mode, and outputs an essentially constant voltage, e.g., 5V, 9V, 12V, 20V, etc., in the constant-voltage mode.

The output voltage of the first adapter is however not suitable for being directly applied to both ends of a battery. Actually, the output voltage of the first adapter needs to be regulated by a conversion circuit built in the device to be charged (e.g., a terminal) in order to obtain a regulated charging voltage and/or charging current desired by the battery (hereinafter, battery desired charging voltage/charging current) of the device to be charged, e.g., a terminal.

The conversion circuit is configured to convert the output voltage of the first adapter to a regulated charging voltage and/or charging current desired by the battery.

An illustrative example of the conversion circuit may be a charging management module, such as a charging integrated circuit (IC), which is configured to regulate the charging voltage and/or charging current of the battery during the battery charging process. The conversion circuit can dynamically regulate the charging voltage and/or charging current desired by the battery according to a present voltage across the battery and/or a present charging current flowing through the battery to effect management of the charging voltage and/or charging current of the battery.

By way of example, the battery charging process may include one or more of a trickle charging stage, a constant-current charging stage, and a constant-voltage charging stage. At the trickle charging stage, the conversion circuit can regulate the current flowing into the battery depending on feedback information indicative of a present charging current of the battery and sent from a current feedback loop to reach the current magnitude of the battery desired charging current, e.g., a first charging current. At the constant-current charging stage, the conversion circuit relies on the current feedback loop to make the current flowing into the battery satisfy the magnitude of another battery desired charging current, e.g., a second charging current that may be greater than the first charging current. In the constant-voltage charging stage, the conversion circuit makes use of a voltage feedback loop to cause the voltage applied to both ends of the battery satisfy the battery desired charging voltage magnitude.

For example, when the output voltage of the first adapter is larger than the battery desired charging voltage, the conversion circuit may be configured to step down the output voltage in order that the charging voltage obtained by step-down should satisfy the requirements of the battery desired charging voltage. As another example, when the output voltage of the first adapter is smaller than the battery desired charging voltage, the conversion circuit may step up the output voltage in order that the charging voltage obtained after the step-up could satisfy the requirements of the battery desired charging voltage.

As a further example, assuming the first adapter outputs a constant voltage of 5V and the battery includes a single cell (e.g., a lithium battery cell, and a single lithium cell typically may have a charge-cutoff voltage of 4.2 V), then the conversion circuit, e.g., a Buck step-down circuit, may be configured to step down the output voltage of the first adapter, making the resulting charging voltage meet the requirements of the battery desired charging voltage.

As another example, assuming the first adapter outputs a constant voltage of 5V to charge a battery having two or more individual cells (e.g., a lithium battery cell, and a single lithium cell typically may have a charge-cutoff voltage of 4.2V) connected in series, then the conversion circuit, e.g., a Boost step-up circuit, may be configured to step up the output voltage of the first adapter, making the resulting charging voltage meet the requirements of the battery desired charging voltage.

Due to low circuit conversion efficiency of the conversion circuit, the portion of the electric energy that is not converted would be dissipated in the form of heat, which may be accumulated inside the device to be charged, e.g., a terminal. The device to be charged (e.g., a terminal) may have a small space intended for design and cooling purposes since, e.g., the physical size of mobile terminals used by users is getting thinner and thinner, and a large number of electronic components or parts are arranged in the mobile terminal for purposes of enhancing its performance, which not only increases the difficulty of design of the conversion circuit, but makes it difficult to remove the heat accumulated inside the device to be charged (e.g., a terminal) causing the device to be charged (e.g., a terminal) to malfunction.

For example, the heat accumulated in the conversion circuit may cause thermal interference with nearby electronic components or parts, causing them to operate abnormally. Another example, the heat accumulated in the conversion circuit may reduce the lifetime of the conversion circuit itself and the nearby components or parts. Yet another example, the heat accumulated in the conversion circuit may cause thermal interference with the battery, resulting in abnormal charging or discharging of the battery. Still another example is that the heat accumulated in the conversion circuit may cause the temperature of the device to be charged (e.g., a terminal) to rise, negatively affecting the user's charging experience. Still another example is that the heat accumulated in the conversion circuit may result in a short circuit of the conversion circuit itself thus letting the output voltage of the first adapter be directly applied to both ends of the battery, leading to abnormal charging. Furthermore, leaving the battery in the over-voltage charging state may even give rise to a battery explosion, endangering the user safety.

Embodiments provide a second adapter with adjustable output voltage. The second adapter is capable of acquiring status information of a battery which may include the present state of charge (SOC) information and/or voltage information of the battery. The second adapter can adjust its output voltage based on the acquired battery status information in order that the requirements of the battery desired charging voltage and/or charging current could be met. Furthermore, in the constant-current charging stage of the battery charging process, the adjusted output voltage of the second adapter can be directly applied to both ends of the battery for charging purposes.

The second adapter may serve the function of a voltage feedback module and that of a current feedback module thus realizing management of the charging voltage and/or charging current of the battery.

By that the second adapter adjusts its output voltage based on the acquired battery status information, it means the second adapter is capable of obtaining the status information of the battery in real time and adjusting its output voltage based on the battery status information obtained in real-time each time so as to satisfy the battery desired charging voltage and/or charging current.

Further, by that the second adapter adjusts its output voltage based on the status information of the battery obtained in real time, it means that as the battery voltage continues to rise as the charging process proceeds, the second adapter can obtain the instantaneous status information of the battery at different points of the charging process and accordingly adjust its output voltage based on the status information of the battery to make it satisfy the requirements of the battery desired charging voltage and/or charging current.

For example, the battery charging process may include one or more of a trickle charging stage, a constant-current charging stage, and a constant-voltage charging stage. At the trickle charging stage, the second adapter may make use of a current feedback loop to cause the current that is output from the second adapter and flows into the battery to satisfy the requirements of the battery desired charging current, e.g., a first charging current. At the constant-current charging stage, the second adapter may rely on the current feedback loop to make the output current of the second adapter that flows into the battery satisfy the requirements of the battery desired charging current, e.g., a second charging current which may be larger than the first charging current. In addition, at the constant-current charging stage, the second adapter can directly load its output charging voltage to both ends of the battery for charging. At the constant-voltage charging stage, the second adapter may make use of a voltage feedback loop to enable the voltage output from the second adapter to satisfy the requirements of the battery desired charging voltage.

In terms of the trickle charging stage and the constant-voltage charging stage, the output voltage of the second adapter may be processed in a similar manner as that adopted by the foregoing first adapter. That is, the output voltage may be converted through a conversion circuit built in the device to be charged (e.g., a terminal) so as to obtain the charging voltage and/or charging current desired by the battery of the device to be charged, e.g., a terminal.

In one implementation, the current feedback loop of the second adapter may be achieved based on a voltage feedback loop combining means of software. When the charging current output from the second adapter does not meet the requirements, the second adapter can calculate the desired charging voltage based on the desired charging current and adjust through the voltage feedback loop the charging voltage output from the second adapter to the calculated desired charging voltage, which is equivalent to accomplish the current feedback loop function based on the voltage feedback loop in combination with means of software. During the charging process of the battery under the constant-voltage mode, however, the load current on the charging circuit often rapidly changes, so for realization of the current feedback loop by means of software, the second adapter may need to perform several intermediate operations including current sampling, current-to-voltage conversion, etc., resulting in the second adapter a slow speed of response to the load current, which may lead to the current drawn by the device to be charged (e.g., a terminal) exceeding the maximum output current threshold the second adapter can supply, thus causing the second adapter to enter an over-load protection state. As a result, the adapter would no longer be able to charge the device to be charged, e.g., a terminal.

To increase the response speed of the second adapter to the load current, a voltage feedback loop and a current feedback loop both in the form of hardware can be provided inside the second adapter, as will be described in detail below in connection with FIG. 1A.

FIG. 1A is a block diagram illustrating a second adapter in accordance with an embodiment. A second adapter 10 may include a power converting unit 11, a voltage feedback unit 12, a current feedback unit 13, and a power adjusting unit 14.

The power converting unit 11 may be configured to convert an input alternating current (AC) to obtain an output voltage and output current of the second adapter 10.

The voltage feedback unit 12 may have an input end coupled to the power converting unit 11 to detect the output voltage of the second adapter 10 to generate a voltage feedback signal that indicates whether the output voltage of the second adapter 10 reaches a target voltage.

The current feedback unit 13 may have an input end coupled to the power converting unit 11 to detect the output current of the second adapter 10 in order to generate a current feedback signal indicating whether the output current of the second adapter 10 reaches a target current.

The power adjusting unit 14 may have an input end coupled to an output end of the voltage feedback unit 12 and to an output end of the current feedback unit 13. An output end of the power adjusting unit 14 may be coupled to the power converting unit 11. The power adjusting unit 14 may be configured to receive the voltage feedback signal and the current feedback signal, and accordingly stabilize the output voltage and output current of the second adapter 10 when the voltage feedback signal indicates the output voltage of the second adapter 10 has reached the target voltage or the current feedback signal indicates the output current of the second adapter 10 has reached the target current.

By that the power adjusting unit 14 stabilizes the output voltage and output current of the second adapter 10, it means the power adjusting unit 14 may control the output voltage and output current of the second adapter 10 to remain unchanged. An example of the power adjusting unit 14 may be a pulse width modulation (PWM) based power adjusting unit, by which the output voltage and output current of the second adapter 10 could be stabilized through keeping the frequency and duty ratio of the PWM control signal constant.

The second adapter according to this embodiment includes both a voltage feedback unit and a current feedback unit. The voltage feedback unit, power adjusting unit, and power converting unit altogether form a hardware circuit that exerts closed-loop control of the output voltage of the second adapter, i.e., forming a hardware voltage feedback loop. The current feedback unit, power adjusting unit, and power converting unit altogether form a hardware circuit that exerts closed-loop control over the output current of the second adapter, i.e., forming a hardware current feedback loop. Based on the double-loop feedback control, the power adjusting unit could take into account the feedback information provided by both the voltage feedback signal and the current feedback signal, and then stabilize the output voltage and output current of the second adapter when either the output voltage or the output current reaches the respective target value. In other words, in embodiments of the present disclosure, once either the output voltage or the output current of the second adapter reaches the respective target value, the power adjusting unit can immediately sense the occurrence of this event and accordingly make an instant response to the event so as to stabilize the output voltage and output current, thus improving the safety of the charging process.

In the constant-voltage mode, for example, the voltage feedback loop may mainly be responsible to adjust the output voltage of the second adapter to the voltage corresponding to the constant-voltage mode, while the current feedback loop may be responsible for detecting whether the output current of the second adapter reaches the target current, and the target current in this case may be the maximum current allowed in the constant-voltage mode. Once the output current of the second adapter reaches the target current, the power adjusting unit can immediately sense this event through the current feedback loop and accordingly stabilize the output current of the second adapter in time to prevent it from further increasing. Likewise, in the constant-current mode, the current feedback loop may be responsible to adjust the output current of the second adapter to the current corresponding to the constant-current mode, while the voltage feedback loop may be responsible for detecting whether the output voltage of the second adapter reaches the target voltage, and the target value in this case may be the maximum voltage allowed in the constant-current mode. Once the output voltage reaches the target voltage, the power adjusting unit would be able to immediately sense this event relying on the voltage feedback loop and accordingly stabilize the output voltage of the second adapter in time to prevent it from further increasing.

Terms "voltage feedback signal" and "current feedback signal" actually differ in the subjects they are intended to reflect, and so should not be construed in a restrictive sense as limiting the signal types of the voltage feedback signal and the current feedback signal. In detail, the voltage feedback signal may be used to feed back an output voltage of the second adapter while the current feedback signal may be used to feed back an output current of the second adapter, but both the voltage feedback signal and the current feedback signal may be voltage signals.

The target voltage may be a preset fixed value, or it may be an adjustable variable. In some embodiments, the second adapter 10 may adjust the voltage value of the target voltage according to actual needs through a certain adjustment circuit. For example, the device to be charged (e.g., a terminal) may send to the second adapter an adjustment instruction to adjust the target voltage, and accordingly the second adapter 10 may adjust the target voltage value in accordance with the adjustment instruction to adjust the target voltage. Alternatively, or additionally, the second adapter 10 may receive the status information of the battery from the device to be charged, and thus adjust the voltage value of the target voltage in real time based on the status of the battery. Similarly, the target current may be a preset fixed value, or it may be an adjustable variable. In some embodiments, the second adapter 10 may adjust the voltage value of the target current according to actual needs through a certain adjustment circuit, for example, the device to be charged (e.g., a terminal) may send to the second adapter 10 an adjustment instruction to adjust the target current, and accordingly the second adapter 10 may adjust the voltage value of the target current in accordance with the adjustment instruction. Alternatively, or additionally, the second adapter 10 may receive the status information of the battery from the device to be charged, and thus adjust the current value of the target current in real time based on the battery status.

The "device to be charged" as used in embodiments herein may be a "communication terminal" (or simply referred to as a "terminal") including, but not limited to, a device to be charged coupled via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or other data connection lines or network connection lines. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with other communication terminals. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver.

In some embodiments, the second adapter 10 may include a control unit (see MCU of FIG. 23) that controls charging of the device to be charged to increase the intelligence of the second adapter 10. More particularly, the control unit may perform two-way communication with the device to be charged (e.g., a terminal) to obtain an instruction or status information of the device to the charged (e.g., a terminal).

The foregoing information can be the present voltage of the battery and/or a temperature of the device to be charged and the like, such that the second adapter 10 can control the charging process of the device to be charged (e.g., a terminal) based on the instruction or status information of the device to be charged, e.g., a terminal. In some embodiments, the control unit may be a micro-controller unit (MCU), but the embodiments are not limited thereto and other types of chips or circuits may be included.

In some embodiments, the second adapter 10 may include a charging interface (see a charging interface 191 illustrated in FIG. 19A), but the type of the charging interface is not particularly limited herein, e.g., the charging interface may include a universal serial bus (USB) interface, and the USB interface may be a standard USB interface, or a micro USB interface, or a Type-C interface.

The charging mode or function of the second adapter 10 correlates with values of the target voltage and target current. Different charging modes or functions of the second adapter 10 may result from different values of the target voltage and target current. Examples of a constant-voltage mode and a constant-current mode are provided below for purposes of illustration.

In some embodiments, the second adapter 10 is operable in a first charging mode, i.e., the second adapter 10 may operate in the first charging mode, to charge the device to be charged such as a terminal. The first charging mode can be the constant-voltage mode. In the constant-voltage mode, the target voltage of the second adapter 10 is the voltage corresponding to the constant-voltage mode, while the target current is the maximum current that the second adapter 10 is able to output under the constant-voltage mode. The power adjusting unit 14 is configured to adjust, based on the voltage feedback signal, the output voltage of the second adapter 10 to a voltage corresponding to the constant-voltage mode, and then control the output current of the second adapter 10 to not exceed the maximum output current of the second adapter 10 that is allowed to output in the constant-voltage mode when the current feedback signal indicates the output current of the second adapter 10 has reached the allowed maximum current.

In the constant-voltage mode, the output voltage of the second adapter 10 may be regulated to a fixed voltage value, i.e., the voltage corresponding to the constant-voltage mode as mentioned above. For example, in the constant-voltage mode, the second adapter 10 may have an output voltage of 5V, and accordingly the voltage corresponding to the constant-voltage mode would be 5V.

In one implementation, the target voltage is set to the voltage corresponding to the constant-voltage mode while the target current is set to the maximum output current of the second adapter that is allowed to output in the constant-voltage mode. Thus, the second adapter will be able to quickly adjust its output voltage to the voltage corresponding to the constant-voltage mode through the voltage feedback loop, so as to charge the device to be charged (e.g., a terminal) in a constant-voltage manner. Once during the constant-voltage charging process the output current, i.e., the load current, of the second adapter reaches its maximum allowable output current, the second adapter can sense this condition in time through the current feedback loop and would accordingly prevent its output current from further increasing in a timely manner, avoiding the occurrence of charging faults and improving the response capability of the second adapter to the load current.

For example, assuming in the constant-voltage mode the corresponding fixed voltage value is 5V, and the output current of the second adapter generally maintains in the range of 100 mA~200 mA. In this case, the target voltage may be set to the fixed voltage value such as 5V, while the target current may be set to 500 mA or 1 A. Once the output current of the second adapter increases to the corresponding current value of the target current, the power adjusting unit 14 can instantly sense the occurrence of this event through the current feedback loop and accordingly prevent the output current of the second adapter from further increasing.

Figure 1B:
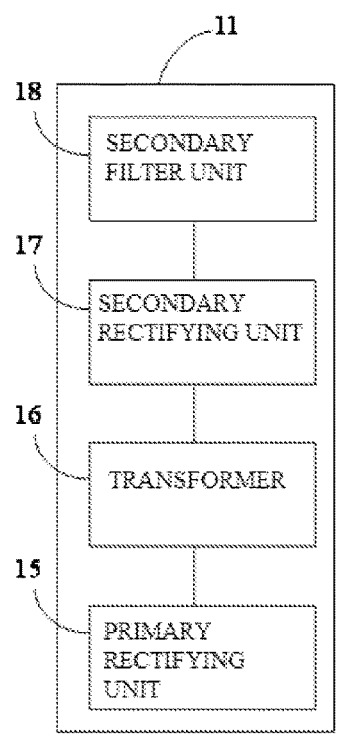
FIG. 1B is a block diagram illustrating a power converting unit in accordance with an embodiment.

As illustrated in FIG. 1B, on the basis of the above embodiments, the power converting unit 11 may include a primary rectifying unit 15, a transformer 16, a secondary rectifying unit 17, and a secondary filter unit 18. The primary rectifying unit 15 may directly output a voltage of a pulsating waveform to the transformer 16.

In the related art, the power converting unit typically includes a rectifying unit and a filter unit at the primary side, and also a rectifying unit and a filter unit at the secondary side. The rectifying unit and filter unit located at the primary side may be called a primary rectifying unit and a primary filter unit respectively. The rectifying unit and filter unit located at the secondary side may be called a secondary rectifying unit and a secondary filter unit respectively. The primary filter unit typically uses a liquid aluminum electrolytic capacitor for filtering, but the relatively large volume of the liquid aluminum electrolytic capacitor will result in a relatively large dimension of the adapter.

In this embodiment, the power converting unit 11 includes the primary rectifying unit 15, the transformer 16, the secondary rectifying unit 17, and the secondary filter unit 18. The primary rectifying unit 15 can directly output a voltage of a pulsating waveform to the transformer 16. In other words, the power converting unit 11 of this embodiment does not include the primary filter unit such that the dimension of the second adapter 10 can be reduced to a great extent, making the second adapter 10 more portable. The secondary filter unit 18 performs filtering mainly based on a solid aluminum electrolytic capacitor. After the primary filter unit is removed from the power converting unit 11, the load current variations can still be responded to in a timely manner although the solid aluminum electrolytic capacitor has limited load capacity, due to the presence of the hardware current feedback loop, thus avoiding a charging failure that otherwise would be caused by an excessive output current of the second adapter.

In the above solution where the primary filter unit is removed, the maximum allowable output current of the second adapter 10 under the constant-voltage mode can be determined based on the capacity of the capacitor(s) in the secondary filter unit. For example, based on the capacity of the capacitor(s) in the secondary filter unit, it can determine that the maximum load current the secondary filter unit can withstand is 500 mA or 1 A, then the target current can be set to 500 mA or 1 A, such that a charging abnormality caused by the output current of the second adapter exceeding the target current can be avoided.

In some embodiments, the second adapter 10 is operable in a second charging mode, i.e., the second adapter 10 may operate in the second charging mode to charge the device to be charged, e.g., a terminal. The second charging mode is a constant-current mode and in the constant-current mode, the target voltage is the maximum voltage the second adapter 10 is able to output under the constant-current mode, while the target current is the current corresponding to the constant-current mode. The power adjusting unit 14 is configured to adjust, based on the current feedback signal, the output current of the second adapter 10 to the current corresponding to the constant-current mode, and then control the output voltage of the second adapter 10 to not surpass the maximum voltage that second adapter 10 is able to output in the constant-current mode when the voltage feedback signal indicates the output voltage of second adapter 10 has reached the allowed maximum output voltage.

Therefore, in the embodiment of the present disclosure, the target current is set to the current corresponding to the constant-current mode and the target voltage is set to the maximum allowed output voltage of the second adapter under the constant-current mode. Thus, the second adapter can quickly adjust its output current to the current corresponding to the constant-current mode through the current feedback loop, to charge the device to be charged (e.g., a terminal). Once during the constant-current charging process the output voltage of the second adapter reaches the maximum allowable output voltage of the second adapter, the second adapter would be able to sense this condition in time through the voltage feedback loop and accordingly prevent its output voltage from further increasing in a timely manner, avoiding the occurrence of charging faults.

Figure 2:
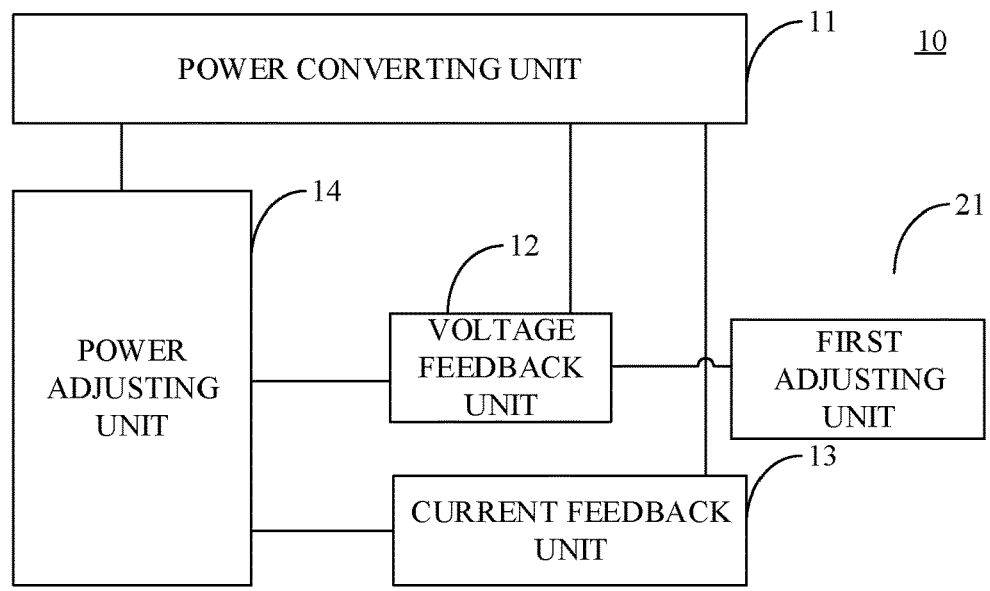
FIG. 2 is a block diagram illustrating a second adapter in accordance with another embodiment.

As illustrated in FIG. 2, the second adapter 10 may further include, on the basis of any of the above embodiments, a first adjusting unit 21 coupled to the voltage feedback unit 12. The first adjusting unit can be configured to adjust a value of the target voltage.

In this embodiment the first adjusting unit is introduced to adjust the output voltage of the second adapter according to practical needs, thereby increasing the intelligence of the second adapter. For example, the second adapter 10 may operate in the first charging mode or the second charging mode, and the first adjusting unit 21 may adjust the value of the target voltage according to the first charging mode or second charging mode currently used by second adapter 10.

Figure 3:
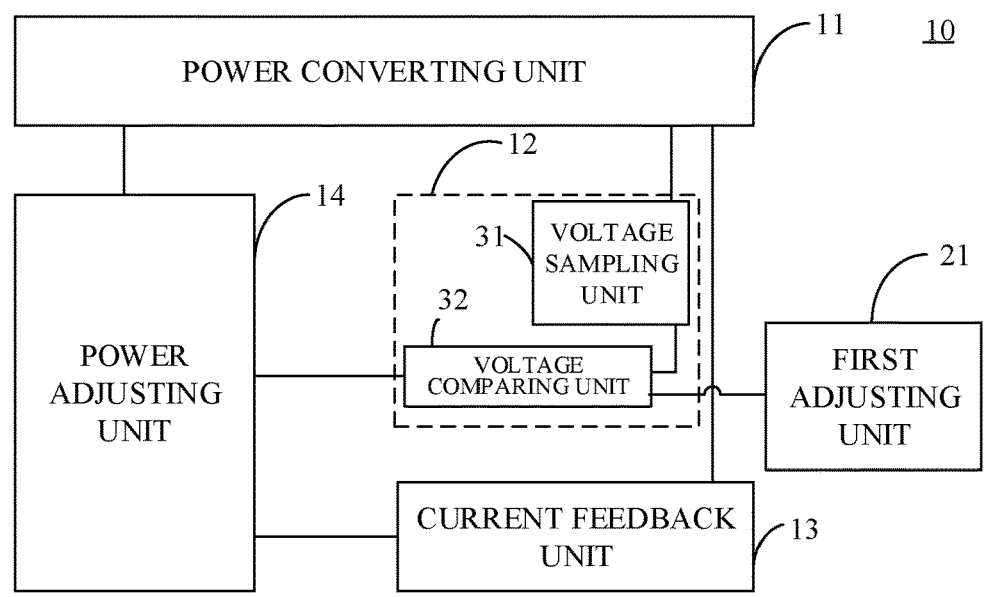
FIG. 3 is a block diagram illustrating a second adapter in accordance with yet another embodiment.

On the basis of the embodiment of FIG. 2, the voltage feedback unit 12 may include a voltage sampling unit 31 and a voltage comparing unit 32, as illustrated in FIG. 3. The voltage sampling unit 31 has an input end coupled to the power converting unit 11 to sample an output voltage of the second adapter 10 to obtain a first voltage. The voltage comparing unit 32 has an input end coupled to an output end of the voltage sampling unit 31. The voltage comparing unit 32 may be configured to compare the first voltage against a first reference voltage to generate a voltage feedback signal based on the comparison. The first adjusting unit 21 is coupled to the voltage comparing unit 32 to supply a first reference voltage to the latter. The first adjusting unit 21 may adjust the value of the first reference voltage to achieve the purpose of adjusting the target voltage.

It will be appreciated that the first voltage in this embodiment corresponds to the output voltage of the second adapter, or the first voltage may denote the magnitude of the present output voltage of the second adapter. In addition, the first reference voltage in this embodiment corresponds to the target voltage, or the first reference voltage denotes the magnitude of the target voltage.

In some embodiments, when the first voltage is smaller than the first reference voltage, the voltage comparing unit may generate a first voltage feedback signal indicating that the output voltage of the second adapter has not yet reached the target voltage; otherwise when the first voltage is equal to the first reference voltage, the voltage comparing unit may obtain a second voltage feedback signal that indicates that the output voltage of the second adapter has already reached the target voltage.

In this embodiment, the form of the voltage sampling unit 31 is not limited, for example, the voltage sampling unit 31 may be a wire, and in this case the first voltage will be the output voltage of the second adapter and the first reference voltage will be the target voltage. As another implementation, the voltage sampling unit 31 may include two resistors connected in series that act as a voltage divider, and in this case the first voltage may be a voltage divided by the two resistors; the value of the first reference voltage would relate to a voltage division ratio of the two resistors. Assuming the target voltage is 5V and when the output voltage of the second adapter has reached 5V, the first voltage is 0.5V after the series voltage division of the two resistors, then the first reference voltage can be set to 0.5V.

The first adjusting unit 21 in the embodiment of FIG. 3 may adjust the first reference voltage in various manners, which will be described below in detail with reference to FIG. 4 to FIG. 6.

Figure 4:
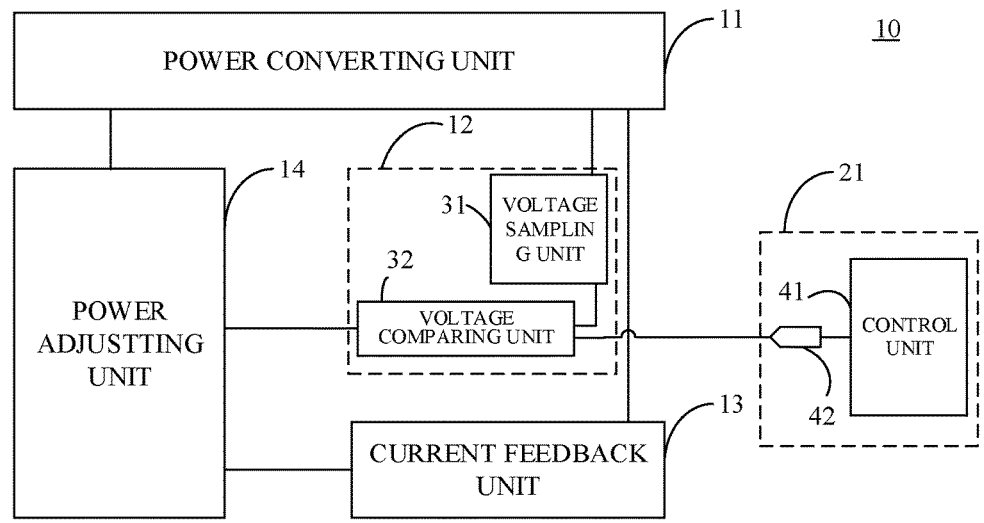
FIG. 4 is a block diagram illustrating a second adapter in accordance with still another embodiment.

In some embodiments, the first adjusting unit 21 may include a control unit 41 and a first digital to analog converter (DAC) 42, as illustrated in FIG. 4. The first DAC 42 may include an input end coupled to the control unit 41 and an output end coupled to the voltage comparing unit 32. The control unit 41 can achieve the purpose of adjusting the value of the first reference voltage through the first DAC 42.

As one implementation, the control unit 41 may be an MCU that may be coupled to the first DAC 42 through a DAC port. The MCU may output a digital signal to the first DAC 42 through the DAC port, and the first DAC 42 may convert the digital signal into an analog signal, where the analog signal acts as the voltage value of the first reference voltage. DAC has the characteristics of fast signal conversion speed and high conversion precision, therefore using the DAC to adjust the reference voltage can improve the adjustment speed and control precision of the second adapter over the reference voltage.

Figure 5:
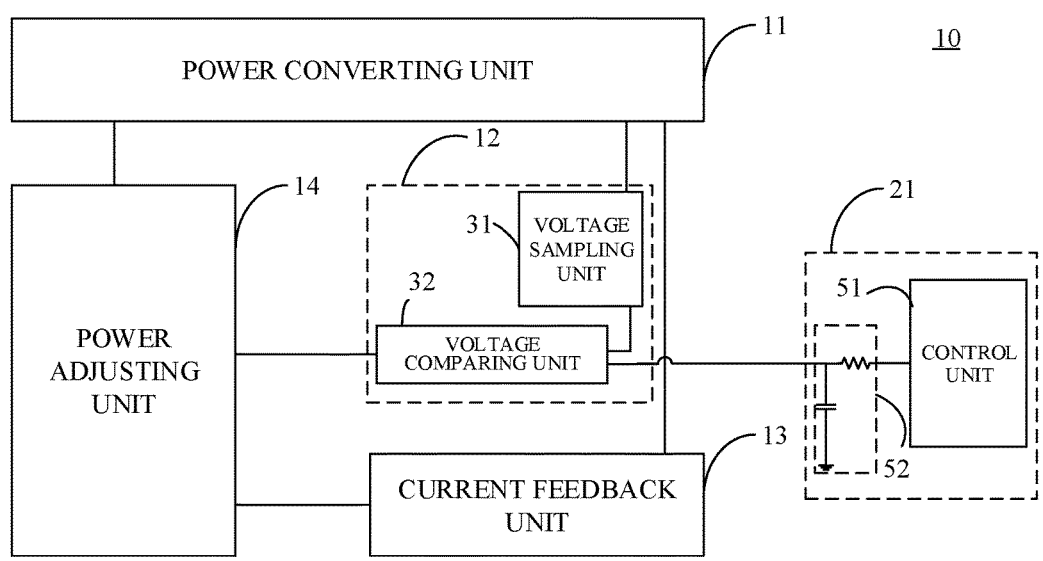
FIG. 5 is a block diagram illustrating a second adapter in accordance with still another embodiment.

In some embodiments, the first adjusting unit 21 may include a control unit 51 and an RC filter unit 52, as illustrated in FIG. 5. The RC filter unit 52 may include an input end coupled to the control unit 51 and an output end coupled to the voltage comparing unit 32. The control unit 51 can be configured to generate a pulse width modulation (PWM) signal and adjust the value of the first reference voltage by adjusting a duty ratio of the PWM signal.

As one implementation, the control unit 51 may be an MCU which may output a PWM signal through a PWM port. The PWM signal later undergoes filtering at the RC filter circuit 52 to create a stable analog quantity, i.e., the first reference voltage. The RC filter circuit 52 has the characteristics of easy implementation and cost efficiency, and so can effectuate the adjustment of the first reference voltage at a relatively lower cost.

Figure 6:
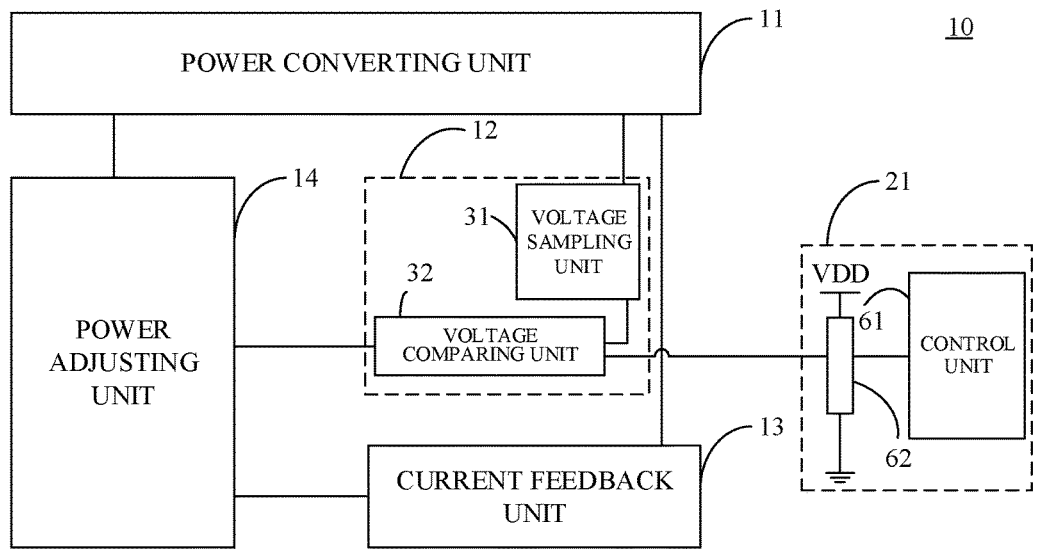
FIG. 6 is a block diagram illustrating a second adapter in accordance with still another embodiment.

In some embodiments, the first adjusting unit 21 may include a control unit 61 and a digital potentiometer 62, as illustrated in FIG. 6. The digital potentiometer 62 may have a control end coupled to the control unit 61 and an output end coupled to the voltage comparing unit 32. The control unit 61 can adjust the value of the first reference voltage by adjusting a voltage division ratio of the digital potentiometer 62.

As one implementation, the control unit 61 may be an MCU coupled to the control end of digital potentiometer 62 through a built-in inter integrated circuit (I2C) interface, to adjust the voltage division ratio of the digital potentiometer 62. The digital potentiometer 62 may include a high-potential end denoted as VDD, i.e., a power supply end, a low-potential end that is grounded, and an output end (or adjustment output end) coupled to the voltage comparing unit 32 to output the first reference voltage to the voltage comparing unit 32. The digital potentiometer has the characteristics of easy implementation and cost efficiency, and so can effectuate the adjustment of the first reference voltage with a relatively lower cost.

Figure 7:
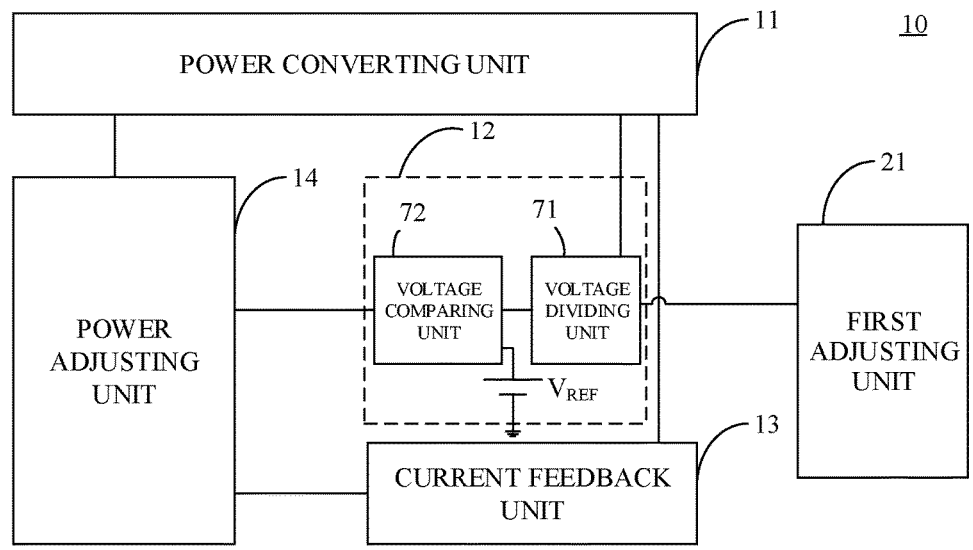
FIG. 7 is a block diagram illustrating a second adapter in accordance with still another embodiment.

On the basis of the embodiment of FIG. 2, as one implementation, the voltage feedback unit 12 may include a voltage dividing unit 71 and a voltage comparing unit 72, as illustrated in FIG. 7. An input end of the voltage dividing unit 71 may be coupled to the power converting unit 11 to divide the output voltage of the second adapter 10 according to a set voltage division ratio to obtain the first voltage. An input end of the voltage comparing unit 72 may be coupled to an output end of the voltage dividing unit 71 to compare the first voltage against the first reference voltage to generate the voltage feedback signal based on the comparison. The first adjusting unit 21 may be coupled to the voltage dividing unit 71 to adjust the voltage division ratio of the voltage dividing unit 71 for the purpose of the adjusting the voltage value of the target voltage.

The embodiment of FIG. 7 differs from those of FIG. 3 to FIG. 6 mainly in that in the latter the adjustment of the target voltage value is achieved by adjusting the reference voltage of the voltage comparing unit, while in the former, the target voltage value is adjusted by adjusting the voltage division ratio of the voltage dividing unit 71. Expressed in a different way, in the embodiment of FIG. 7, the first reference voltage may be set to a fixed value $V_{REF}$, and if the output voltage of the second adapter is desired as 5V, the voltage division ratio of the voltage dividing unit 71 can be adjusted in order that the voltage at its output end should be equal to $V_{REF}$ when the output voltage of the second adapter is 5V. Similarly, if the desired output voltage of the second adapter is 3V, then the voltage division ratio of the voltage dividing unit 71 would be adjusted in order that the voltage at its output end should be equal to $V_{REF}$ when the output voltage of the second adapter is 3V.

In this embodiment, the voltage dividing unit is configured to accomplish the output voltage sampling and target voltage adjustment of the second adapter, simplifying the circuit structure of the second adapter.

In addition, the voltage dividing unit 71 can be implemented in various manners. For example, the aforementioned voltage division function and voltage division ratio adjustment function can be realized through the use of a digital potentiometer, or discrete resistors, switches, and the like.

Figure 8:
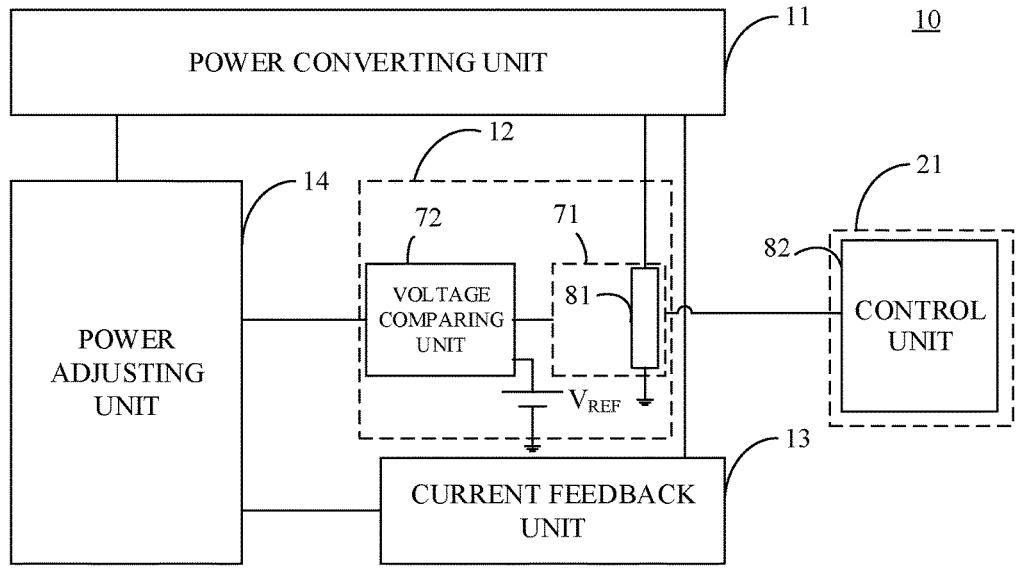
FIG. 8 is a block diagram illustrating a second adapter in accordance with still another embodiment.

Take implementation of a digital potentiometer as an example, the voltage dividing unit 71 may include a digital potentiometer 81, as illustrated in FIG. 8. The first adjusting unit 21 may include a control unit 82. A high-potential end of the digital potentiometer 81 may be coupled to the power converting unit 11, while a low-potential end of the digital potentiometer 81 may be grounded. An output end of the digital potentiometer 81 may be coupled to the input end of the voltage comparing unit 72. The control unit 82 may be coupled to a control end of the digital potentiometer 81 to adjust the voltage division ratio of the digital potentiometer 81.

Figure 9:
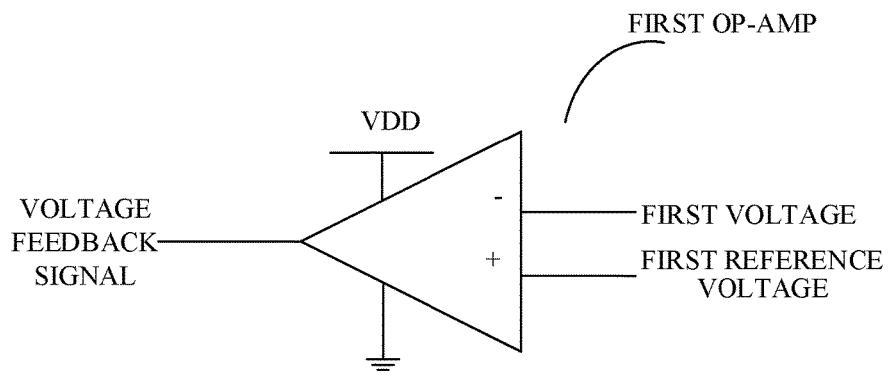
FIG. 9 is a block diagram illustrating a voltage comparing unit in accordance with an embodiment.

The voltage comparing unit 72 as described above can also be implemented in various manners. In some embodiments, the voltage comparing unit 72 may incorporate a first operational amplifier (hereinafter, op-amp), as illustrated in FIG. 9. The first op-amp may include a reversed-phase input end configured to receive the first voltage, an in-phase input end configured to receive the first reference voltage, and an output end configured to generate the voltage feedback signal. The first op-amp may also be called a first error amplifier, or a voltage error amplifier.

Figure 10:
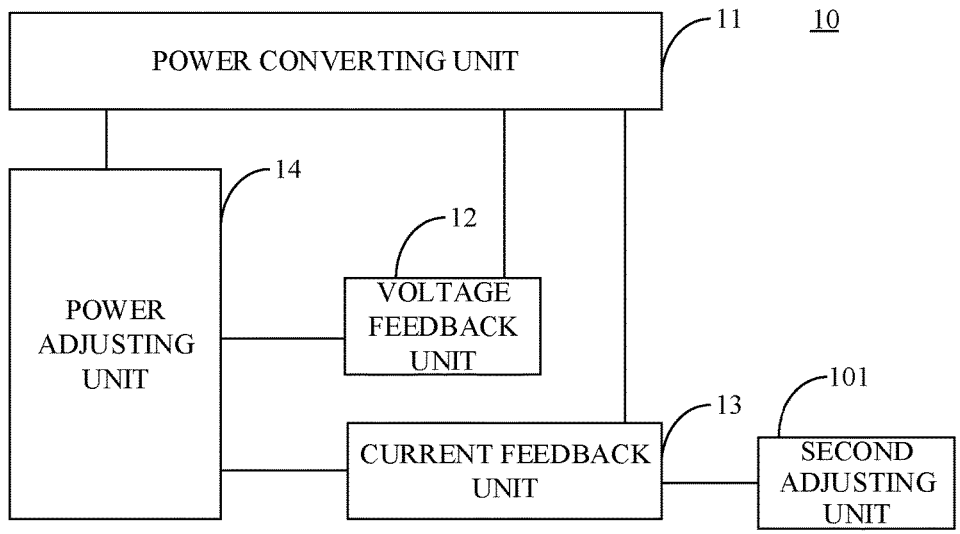
FIG. 10 is a block diagram illustrating a second adapter in accordance with still another embodiment.

As illustrated in FIG. 10, the second adapter 10 may further include, on the basis of any of the above embodiments, a second adjusting unit 101 coupled to the current feedback unit 13 to adjust the current value of the target current.

In this embodiment, a second adjusting unit is introduced to adjust the output current of the second adapter to meet practical needs, increasing the intelligence of the second adapter. For example, the second adapter 10 may operate in the first charging mode or the second charging mode, and the second adjusting unit 101 may adjust the value of the target current based on the first charging mode or second charging mode currently used by the second adapter 10.

Figure 11:
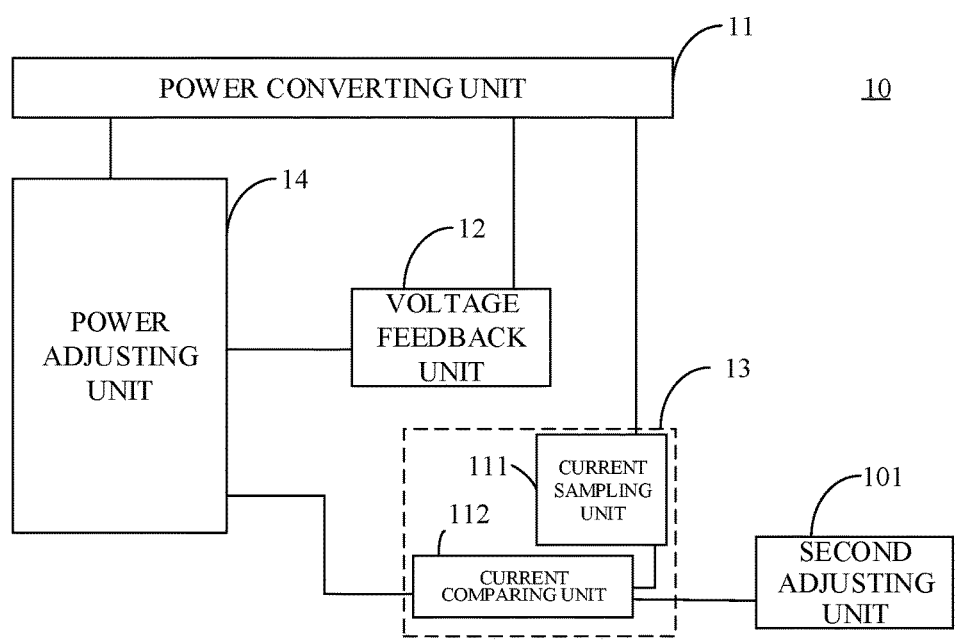
FIG. 11 is a block diagram illustrating a second adapter in accordance with still another embodiment.

In some embodiments, on the basis of the embodiment of FIG. 10, as illustrated in FIG. 11, the current feedback unit 13 may optionally include a current sampling unit 111 and a current comparing unit 112. An input end of the current sampling unit 111 is coupled to the power converting unit 11 to sample an output current of the second adapter 10 to obtain a second voltage that indicates magnitude of the output current of the second adapter 10. An input end of the current comparing unit 112 may be coupled to an output end of the current sampling unit 111 to compare the second voltage against a second reference voltage to generate the current feedback signal based on the comparison. The second adjusting unit 101 may be coupled to the current comparing unit 112 to supply the second reference voltage to the latter, and adjust the voltage value of the second reference voltage to adjust the target current value.

It will be appreciated that the second voltage in this embodiment corresponds to the output current of the second adapter, or it is used to denote the magnitude of the output current of the second adapter. In addition, the second reference voltage in this embodiment corresponds to the target current, or it denotes the magnitude of the target current.

When the second voltage is smaller than the second reference voltage, the current comparing unit may generate a first current feedback signal that indicates that the output current of the second adapter has not yet reached the target current; otherwise when the second voltage is equal to the second reference voltage, the current comparing unit would generate a second current feedback signal indicating that the output current of the second adapter already has reached the target current.

The current sampling unit 111 may obtain the second voltage as follows. The current sampling unit 111 may first sample an output current of the second adapter to obtain a sampling current, and then convert the sampling current into the corresponding sampling voltage based on the sampling current magnitude, in which the sampling voltage value equals the product of the sampling current value and the sampling resistance value. In some embodiments, the sampling voltage may be directly used as the second voltage. In other embodiments, however, multiple resistors may be used to divide the sampling voltage and the divided voltage may be used as the second voltage. The current sampling function of the current sampling unit 111 can be accomplished by a galvanometer.

The second adjusting unit of the embodiment of FIG. 11 may adjust the second reference voltage in various manners, which will be described below in detail with reference to FIG. 12 to FIG. 14.

Figure 12:
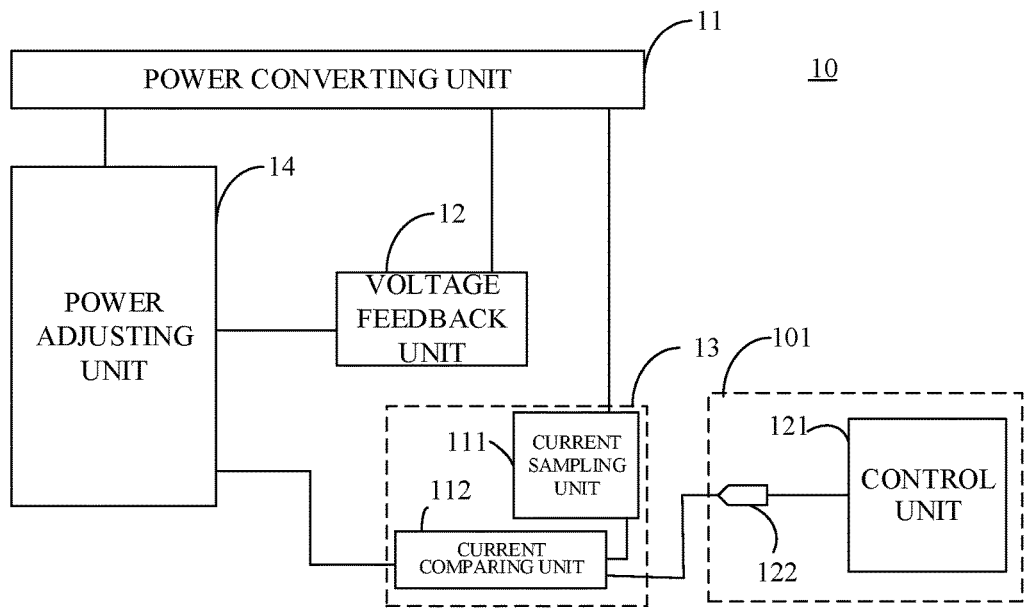
FIG. 12 is a block diagram illustrating a second adapter in accordance with still another embodiment.

In some embodiments, the second adjusting unit 101 may include a control unit 121 and a second DAC 122, as illustrated in FIG. 12. The second DAC 122 may include an input end coupled to the control unit 121, and an output end coupled to the current comparing unit 112. The control unit 121 can adjust the voltage value of the second reference voltage through the second DAC 122.

The control unit 121 may be an MCU coupled to the second DAC 122 via a DAC port. The MCU may output a digital signal to the second DAC 122 through the DAC port and the second DAC 122 may convert the digital signal to an analog signal which is the voltage value of the first reference voltage. DAC has features of fast signal conversion speed and high conversion precision, therefore using the DAC to adjust the reference voltage can improve the adjustment speed and control precision of the second adapter over the reference voltage.

Figure 13:
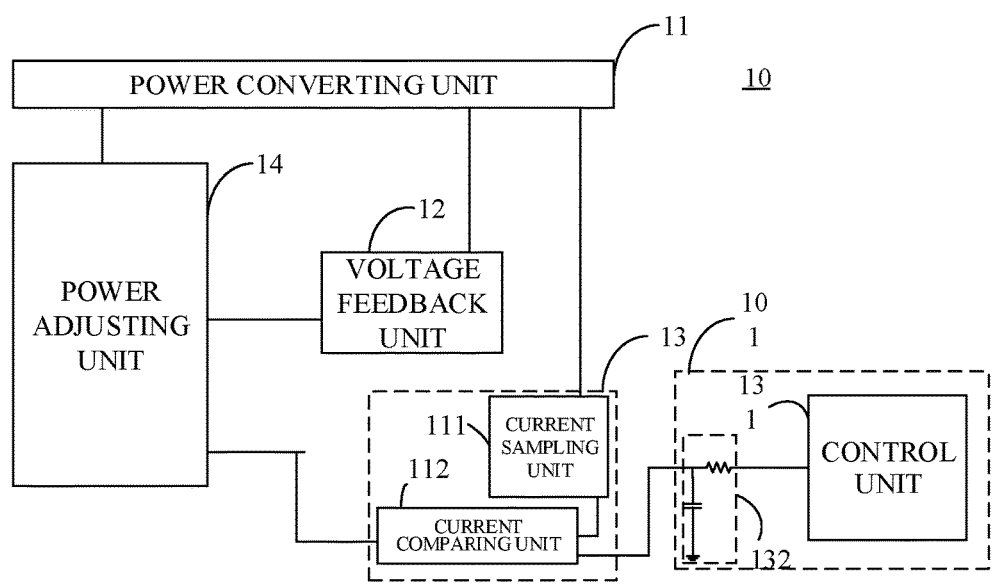
FIG. 13 is a block diagram illustrating a second adapter in accordance with still another embodiment.

In some embodiments, as illustrated in FIG. 13, the second adjusting unit 101 may include a control unit 131 and an RC filter unit 132. The RC filter unit 132 may include an input end coupled to the control unit 131 and an output end coupled to the current comparing unit 112. The control unit 131 may be used to generate a PWM signal and accordingly adjust the voltage value of the second reference voltage through adjusting a duty ratio of the PWM signal.

As one implementation, the control unit 131 may be an MCU which may output a PWM signal through a PWM port. The PWM signal may undergo filtering at the RC filter unit 132 to create a stable analog quantity, i.e., the second reference voltage. The RC filter circuit 132 has features of easy implementation and cost efficiency, and so can effectuate the adjustment of the second reference voltage at a relatively lower cost.

Figure 14:
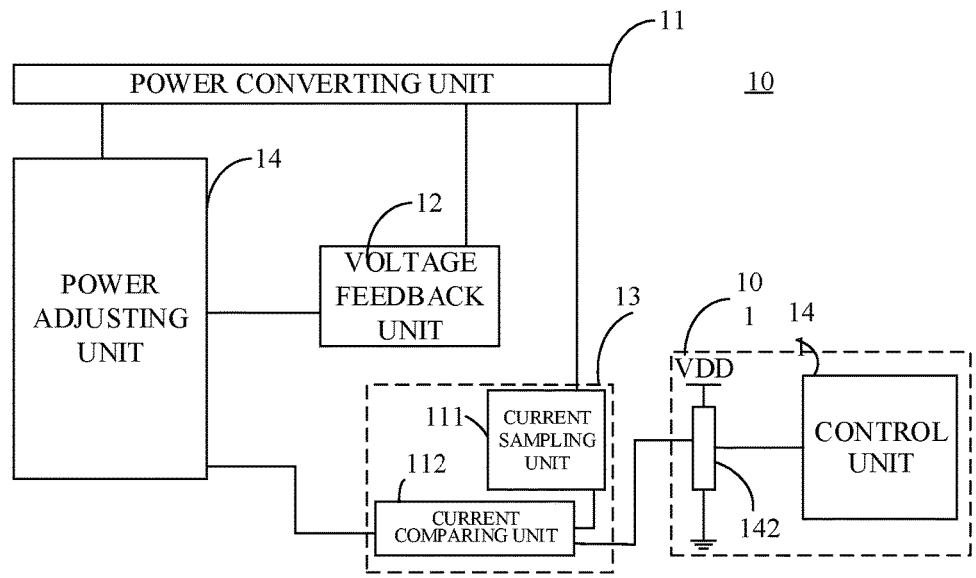
FIG. 14 is a block diagram illustrating a second adapter in accordance with still another embodiment.

In some embodiments, optionally, the second adjusting unit 101 may include a control unit 141 and a digital potentiometer 142, as illustrated in FIG. 14. The digital potentiometer 142 may include a control end coupled to the control unit 141 and an output end coupled to the current comparing unit 112. The control unit 141 can adjust the voltage value of the second reference voltage by adjusting a voltage division ratio of the digital potentiometer 142.

In some embodiments, the control unit 141 may be an MCU coupled through an I2C interface to the control end of digital potentiometer 142 to adjust the voltage division ratio of the digital potentiometer 142. A high-potential end of the digital potentiometer 142 may be denoted as VDD, i.e., a power supply end, and a low-potential end of digital potentiometer 142 may be grounded. An output end (or adjustment output end) of the digital potentiometer 142 may be coupled to the current comparing unit 112 to output the second reference voltage to the current comparing unit 112. The digital potentiometer has features of easy implementation and cost efficiency, and so can effectuate the adjustment of the second reference voltage with a relatively lower cost.

Figure 15:
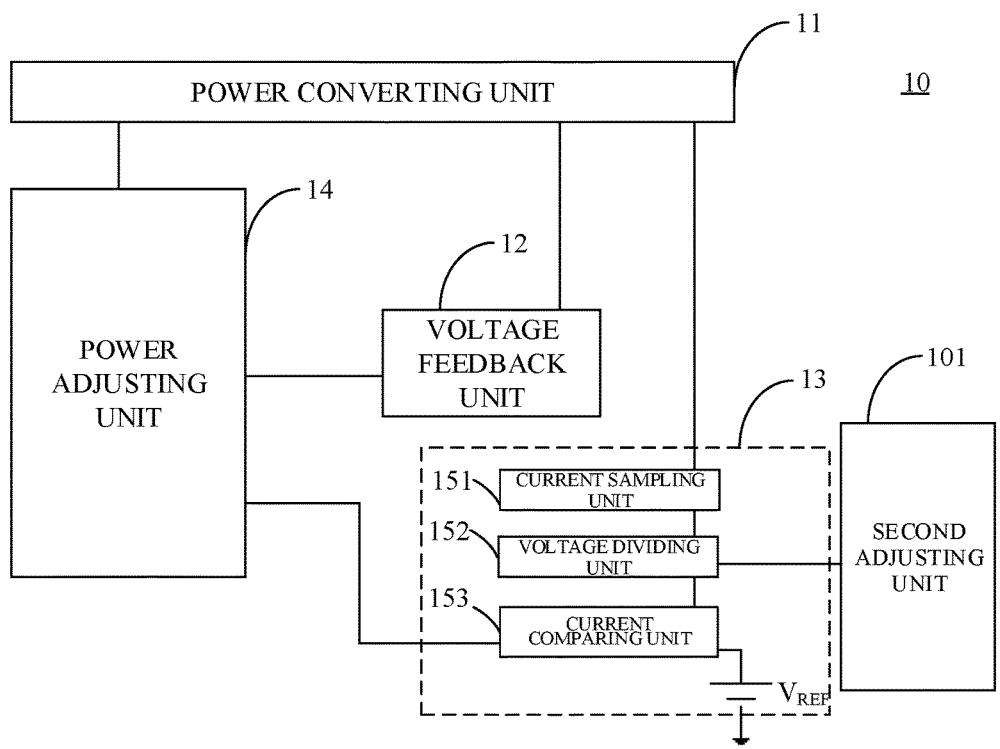
FIG. 15 is a block diagram illustrating a second adapter in accordance with still another embodiment.

In some embodiments, on the basis of the embodiment of FIG. 10, the current feedback unit 13 may include a current sampling unit 151, a voltage dividing unit 152, and a current comparing unit 153, as illustrated in FIG. 15. An input end of the current sampling unit 151 is coupled to the power converting unit 11 to sample an output current of the second adapter 10 to obtain a third voltage that indicates the magnitude of the output current of the second adapter 10. An input end of the voltage dividing unit 152 may be coupled to an output end of the current sampling unit 151 to divide the third voltage according to a set voltage division ratio, so as to obtain a second voltage. An input end of the current comparing unit 153 may be coupled to an output end of the voltage dividing unit 152 to compare the second voltage against a second reference voltage, so as to generate a current feedback signal based on the comparison. The second adjusting unit 101 may be coupled to the voltage dividing unit 152 and may adjust the current value of the target current by adjusting the voltage division ratio of the voltage dividing unit 152.

The embodiment of FIG. 15 differs from those of FIG. 11 to FIG. 14 mainly in that in the latter the adjustment of the target current value is achieved by adjusting the reference voltage of the current comparing unit, while in the former, the target current value is adjusted by adjusting the voltage division ratio of voltage dividing unit 152. In other words, in the embodiment of FIG. 15, the second reference voltage may be set to a fixed value $V_{REF}$, and if the output current of the second adapter is desired as 300 mV, the voltage division ratio of the voltage dividing unit 152 can be adjusted in order that the voltage at the output end of the voltage dividing unit 152 should be equal to $V_{REF}$ when the output current of the second adapter is 300 mV. Similarly, if the desired output current of the second adapter is 500 mV, then the voltage division ratio of the voltage dividing unit 152 can be adjusted in order that the voltage at its output end should be equal to $V_{REF}$ when the output current of the second adapter is 500 mV.

In this embodiment, the voltage dividing unit 152 can be implemented in various manners, e.g., the above-mentioned voltage division function and voltage division ratio adjustment function can be realized through the use of a digital potentiometer, or discrete resistors, switches, and the like.

Figure 16:
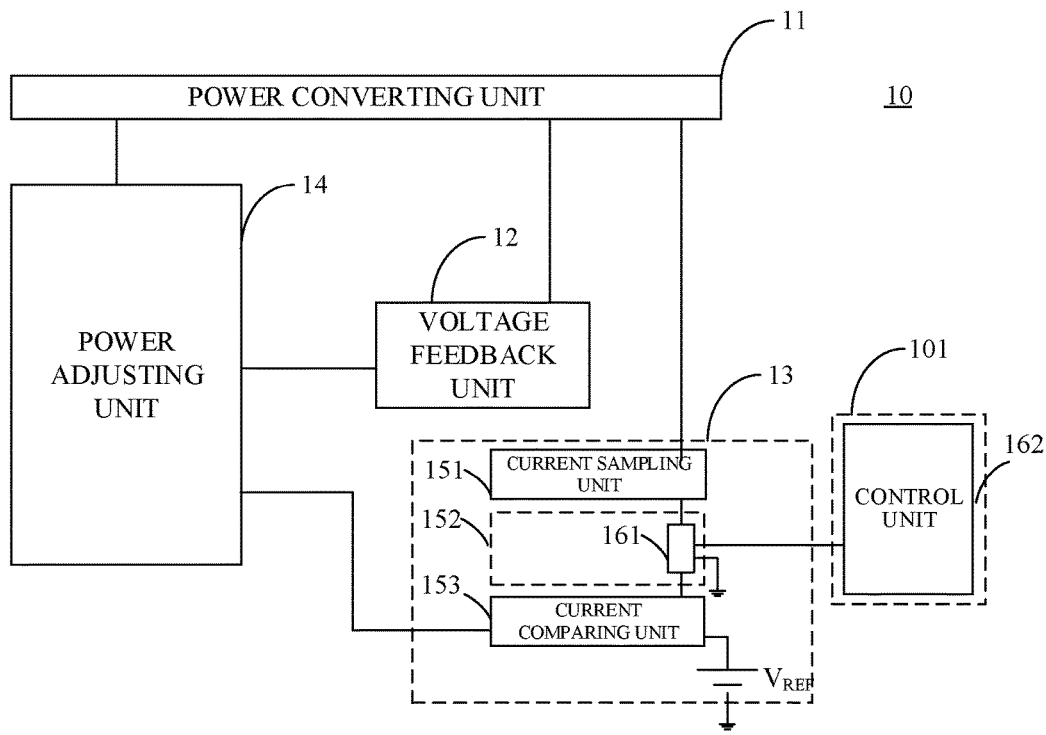
FIG. 16 is a block diagram illustrating a second adapter in accordance with still another embodiment.

Taking the digital potentiometer as an example, the voltage dividing unit 152 may include a digital potentiometer 161, and the second adjusting unit 101 may include a control unit 162, as illustrated in FIG. 16. The digital potentiometer 161 may include a high-potential end coupled to the output end of the current sampling unit 151, a low-potential end connected to ground, and an output end coupled to the input end of the current comparing unit 153. The control unit 162 may be coupled to a control end of the digital potentiometer 161 to adjust the voltage division ratio of the digital potentiometer 161.

The control unit described above may include one or more control units. In some embodiments, the control unit of the first adjusting unit and that of the second adjusting unit may be implemented by the same control unit.

Figure 17:
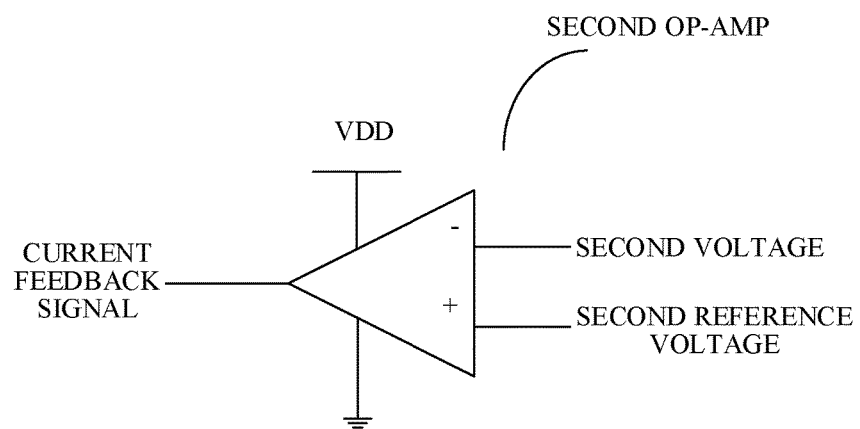
FIG. 17 is a block diagram illustrating a current comparing unit in accordance with an embodiment.

The above-mentioned current comparing unit 153 can be implemented in various manners. For example, in some embodiments, the current comparing unit 153 may incorporate a second operational amplifier (often op-amp), as illustrated in FIG. 17. The second op-amp may include a reversed-phase input end configured to receive the second voltage, an in-phase input end configured to receive the second reference voltage, and an output end configured to generate the current feedback signal. The second op-amp may also be referred to as a second error amplifier, or a current error amplifier.

Implementations of the voltage feedback unit 12 and the current feedback unit 13, as well as manners of adjusting the corresponding target voltage of the voltage feedback unit 12 and the corresponding target current of the current feedback unit 13 have been described in detail above in connection with FIG. 1 to FIG. 17, hereinafter, implementations of the power adjusting unit 14 will be described in detail with reference to FIG. 18.

Figure 18:
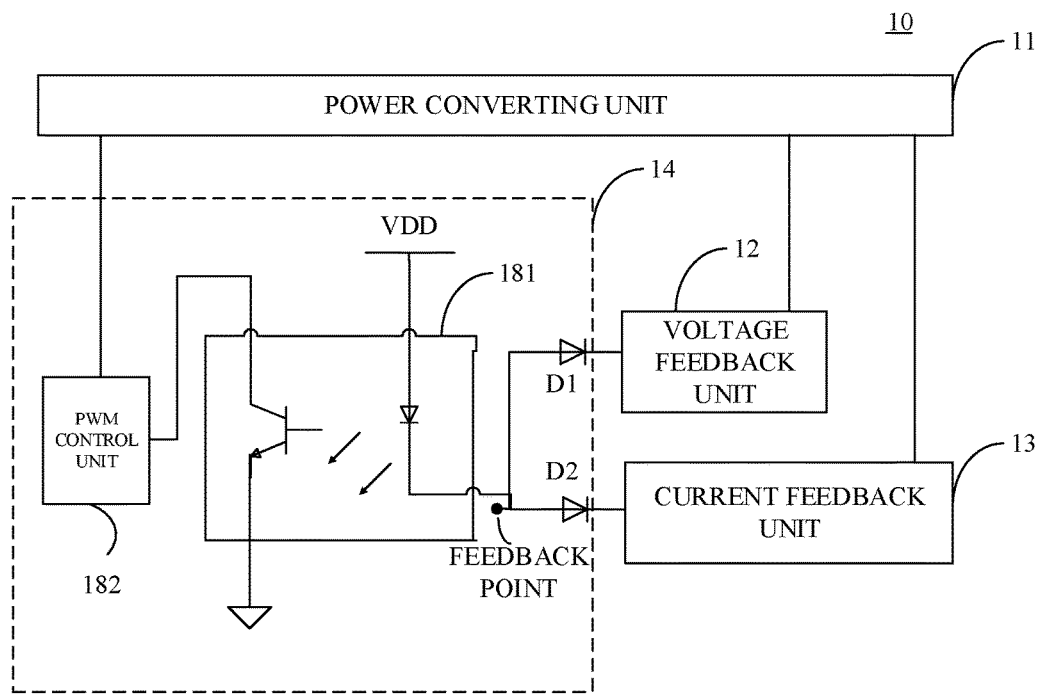
FIG. 18 is a block diagram illustrating a second adapter in accordance with still another embodiment.

In some embodiments, the voltage feedback unit 12 may include a first op-amp (not illustrated in FIG. 18, see FIG. 9) having an output end configured to output a voltage feedback signal, as illustrated in FIG. 18. The current feedback unit 13 may include a second op-amp (not illustrated in FIG. 18, see FIG. 17) having an output end configured to output a current feedback signal. The power adjusting unit 14 may include a first diode D1, a second diode D2, a photoelectric coupling unit 181, and a PWM control unit 182. The output end of the first op-amp (see FIG. 9, the output end of the first op-amp is configured to output the voltage feedback signal) of the voltage feedback unit 12 may be coupled to a cathode of the first diode D1. An anode of the first diode D1 may be coupled to an input end of the photoelectric coupling unit 181. The output end of the second op-amp (see FIG. 17, the output end of the second op-amp is configured to output the current feedback signal) of the current feedback unit 13 may be coupled to a cathode of the second diode D2. An anode of the second diode D2 may be coupled to the input end of the photoelectric coupling unit 181. An output end of the photoelectric coupling unit 181 may be coupled to an input end of the PWM control unit 182. An output end of the PWM control unit 182 may be coupled to the power converting unit 11.

It is to be understood that the first op-amp mentioned herein may refer to the same op-amp. Similarly, the second op-amp that appears in various places herein may also refer to the same op-amp.

In this embodiment, a voltage signal output from the first op-amp may be the voltage feedback signal, and a voltage signal output from the second op-amp may be the current feedback signal. The voltage signal output from the first op-amp being "0" may indicate that the output voltage of the second adapter has reached the target voltage, while a voltage signal output from the second op-amp being "0" may denote that the current at the output end of second adapter has reached the target current. The first diode D1 and second diode D2 may be diodes connected in reverse parallel. Thus if any of the first op-amp and the second op-amp outputs a voltage signal "0", the feedback point voltage in FIG. 18 would be approximately 0, but the actual feedback point voltage may be slightly greater than 0, such as 0.7V, because the diode requires a certain amount of voltage difference to conduct. In this case, the photoelectric coupling unit 181 would operate in a steady state and accordingly output a stable voltage signal to the PWM control unit 182, such that the PWM control unit 182 may generate a PWM signal having a certain duty ratio, so as to stabilize the output voltage and output current of the second adapter through the power converting unit 11. In other words, when any of the output voltage and output current of the second adapter reaches the respective target value, the first diode D1 and second diode D2 that are connected in reverse parallel would be able to immediately sense the occurrence of this event, and accordingly will stabilize the output voltage and output current of the second adapter.

In some embodiments, the second adapter 10 is operable in a first charging mode and a second charging mode, where in the second charging mode the charging speed of the second adapter 10 to charge the device to be charged (e.g., a terminal) may be faster than that in the first charging mode. That is to say, compared to the second adapter 10 operating in the first charging mode, it would take a shorter time for the second adapter 10 operating in the second charging mode to fully charge the battery of the device to be charged (e.g., a terminal) having the same capacity.

The second adapter 10 may include a control unit that can perform two-way communication with the device to be charged (e.g., a terminal) during connection between the second adapter 10 and the device to be charged (e.g., a terminal) so as to control the charging process in the second charging mode. The control unit may be any one mentioned in the embodiments described above, e.g., the control unit of the first adjusting unit or that of the second adjusting unit.

The first charging mode may be a normal charging mode, while the second charging mode may be a quick charging mode. By the normal charging mode, it means that the second adapter outputs a relatively small current value (often below 2.5 A) or charges the battery of the device to be charged (e.g., a terminal) with a relatively small power (often less than 15 W). Thus to fully charge a relatively large capacity battery, such as a battery having a capacity of 3000 mAh, under the normal charging mode, it may take a few hours. By contrast, in the quick charging mode, the second adapter can output a comparatively large current (often larger than 2.5 A, e.g., 4.5 A, 5 A, or even higher) or charges the battery of the device to be charged (e.g., a terminal) with a relatively large power (often greater than or equal to 15 W). Therefore, compared with the normal charging mode, the time required for the second adapter to fully charge a battery of the same capacity under the quick charging mode can be significantly shortened, resulting in a faster charging speed.

In the embodiments of the present disclosure, the communication contents communicated between the control unit of the second adapter and the device to be charged (e.g., a terminal) as well as the control mode by which the control unit controls over the second adapter to output in the second charging mode will not be limited. For example, the control unit may communicate with the device to be charged (e.g., a terminal) to interchange the present voltage of the battery or state of charge (SOC) of the device to be charged (e.g., a terminal), and further adjust the output voltage or output current of the second adapter based on the present voltage of the battery or SOC. Hereinafter the communication contents between the control unit and the device to be charged (e.g., a terminal) together with the control mode by which the control unit controls the second adapter to output in the second charging mode will be described in detail in connection with embodiments.

In some embodiments, the control unit may perform two-way communication with the device to be charged (e.g., a terminal) to control the second adapter output in the second charging mode. In detail, the control unit may perform two-way communication with the device to be charged (e.g., a terminal) to negotiate a charging mode therebetween.

In some embodiments, the second adapter will not indiscriminately use the second charging mode to quick charge the device to be charged (e.g., a terminal) but instead will perform two-way communication with the device to be charged (e.g., a terminal) to negotiate whether the second adapter is approved to use the second charging mode to quick charge the device to be charged (e.g., a terminal) so as to improve the safety of the charging process.

In one implementation, the control unit may send a first instruction to the device to be charged (e.g., a terminal). The first instruction can be configured to inquire the device to be charged (e.g., a terminal) whether to enable the second charging mode. The control unit may then receive from the device to be charged (e.g., a terminal) a reply instruction responsive to the first instruction, and the reply instruction responsive to the first instruction indicates whether the device to be charged (e.g., a terminal) agrees to enable the second charging mode. If the device to be charged (e.g., a terminal) agrees to enable the second charging mode, the control unit would use the second charging mode to charge the device to be charged, e.g., a terminal.

The above description, however, will not limit the master-slave relations between the second adapter (or the control unit of the second adapter) and the device to be charged, e.g., a terminal. In other words, either the control unit or the device to be charged (e.g., a terminal) may act as the master device to initiate two-way communication session, and accordingly the other side may act as the slave device to make a first response or first reply to the communication initiated by the master device. As a possible implementation, during the communication process their roles of master device and slave device may be determined by comparing the electrical levels at the second adapter side and at the device to be charged (e.g., a terminal) side respectively relative to the earth.

In the embodiments of the present disclosure, the implementation of two-way communication between the second adapter (or the control unit of the second adapter) and the device to be charged (e.g., a terminal) is not limited. That is, either of the second adapter (or the control unit of the second adapter) and the device to be charged (e.g., a terminal) may act as the master device to commence a communication session, and accordingly the other side may act as the slave device to make a first response or first reply to the communication session initiated by the master device. In addition, the master device may make a second response to the first response or first reply from the slave device, and hitherto one cycle of charging mode negotiation process between the master device and the slave device would be regarded to complete. In a possible implementation, the master device and slave device may perform multiple cycles of charging mode negotiations before executing the charging operation therebetween, so as to ensure that the charging process subsequent to the negotiation could be safely and reliably carried out.

An example in which the master device makes the second response to the slave device's first response or first reply with respect to the communication session may as follows. That is, the master device may receive from the slave device its first response or first reply to the communication session, and accordingly make a targeted second response to the first response or first reply. By way of example, when the master device receives within a predetermined length of time from the slave device its first response or first reply with respect to the communication session, the master device may make the second response targeted at the first response or first reply from the slave device as follows. That is, the master device and the slave device may perform one cycle of charging mode negotiation before they execute the charging operation in accordance with the first charging mode or the second charging mode according to a result of the negotiation, namely the second adapter may operate in the first charging mode or the second charging mode according to the negotiation result to charge the device to be charged, e.g., a terminal.

Another example in which the master device makes the further second response to the slave device's first response or first reply with respect to the communication session may as follows. That is, the master device may not receive within a predetermined length of time the slave device's first response or first reply to the communication session, but the master device may still make a targeted second response to the first response or first reply from the slave device. For example, when it does not receive within the predetermined length of time the slave device's first response or first reply to the communication session, the master device may still make the second response targeted at the first response or first reply received from the slave device as follows. That is, the master device and the slave device may perform one cycle of charging mode negotiation before they execute the charging operation in accordance with the first charging mode, namely the second adapter may operate in the first charging mode to charge the device to be charged, e.g., a terminal.

In some embodiments, optionally, when the device to be charged (e.g., a terminal) initiates a communication session acting as the master device and the second adapter (or the control unit of the second adapter) acts as the slave device to offer a first response or first reply to the communication session initiated by the master device, the second adapter (or the control unit of the second adapter) and the device to be charged (e.g., a terminal) may be considered to have completed one cycle of charging mode negotiation without the device to be charged (e.g., a terminal) making the targeted second response to the first response or first reply from the second adapter. Consequently, the second adapter would determine to charge the device to be charged (e.g., a terminal) using the first charging mode or the second charging mode according to the negotiation result.

In some embodiments, optionally, the control unit may perform two-way communication with the device to be charged (e.g., a terminal) to control the second adapter to output in the second charging mode in the following manner. The control unit may perform two-way communication with the device to be charged (e.g., a terminal) to determine the output charging voltage of the second adapter in the second charging mode that is used to charge the device to be charged, (e.g., a terminal). The control unit may adjust the voltage value of the target voltage to be equal to the output charging voltage of the second adapter in the second charging mode that is used to charge the device to be charged, (e.g., a terminal).

As one implementation, the control unit may send to the device to be charged (e.g., a terminal) a second instruction inquiring whether the output voltage of the second adapter matches the present voltage of the battery of the device to be charged, e.g., a terminal. The control unit may receive from the device to be charged (e.g., a terminal) a reply instruction responsive to the second instruction, which indicates whether the output voltage of the second adapter is matching, high, or low with respect to the present voltage of the battery. Alternatively, the second instruction may be configured to inquire whether the present output voltage of the second adapter is suitable as the output charging voltage of the second adapter for charging the device to be charged (e.g., a terminal) in the second charging mode, while the reply instruction responsive to the second instruction may be configured to indicate whether the present output voltage of the second adapter is matching, high, or low. That the present output voltage of the second adapter matches the present voltage of the battery or is suitable as the second adapter's output charging voltage in the second charging mode for charging the device to be charged (e.g., a terminal) can mean that the present output voltage of the second adapter is slighter higher than the present voltage of the battery and the difference between the output voltage of the second adapter and the present voltage of the battery is within a predetermined range, usually on the order of several hundred millivolts.

In some embodiments, the control unit may perform two-way communication with the device to be charged (e.g., a terminal) to control the second adapter to output in the second charging mode in the following manner. The control unit may perform two-way communication with the device to be charged (e.g., a terminal) to determine the charging current that is output by the second adapter in the second charging mode and is used to charge the device to be charged (e.g., a terminal). The control unit may adjust the current value of the target current to be equal to the charging current that is output by the second adapter in the second charging mode and is used to charge the device to be charged (e.g., a terminal).

In one implementation, the control unit performs two-way communication with the device to be charged to determine the charging current that is output from the second adapter and is used to charge the device to be charged can be as follows. The control unit may send a third instruction to the device to be charged (e.g., a terminal) to inquire the maximum charging current that is currently supported by the device to be charged, e.g., a terminal. The control unit may receive from the device to be charged (e.g., a terminal) a reply instruction responsive to the third instruction; the reply instruction responsive to the third instruction is configured to indicate the maximum charging current currently supported by the device to be charged (e.g., a terminal). The control unit may then determine the charging current that is output by the second adapter in the second charging mode and is used to charge the device to be charged (e.g., a terminal) based on the maximum charging current currently supported by device to be charged, e.g., a terminal. It will be appreciated that the control unit may determine the charging current that is output by the second adapter in the second charging mode and is used to charge the device to be charged (e.g., a terminal) based on the currently supported maximum charging current of the device to be charged (e.g., a terminal) in various manners. For example, the second adapter may determine the currently supported maximum charging current of the device to be charged (e.g., a terminal) as the second adapter's output charging current in the second charging mode that is used to charge the device to be charged (e.g., a terminal) or otherwise may take into consideration factors including the currently supported maximum charging current of the device to be charged (e.g., a terminal) and the electric current output capability of the second adapter per se before determining its output charging current in the second charging mode that is used to charge the device to be charged (e.g., a terminal).

In some embodiments, the control unit may perform two-way communication with the device to be charged (e.g., a terminal) to control the second adapter to output in the second charging mode in the following manner. That is, when the second adapter charges the device to be charged (e.g., a terminal) using the second charging mode, the control unit may perform two-way communication with the device to be charged (e.g., a terminal) to adjust the output current of the second adapter in the second charging mode.

As one implementation, the process that the control unit performs two-way communication with the device to be charged (e.g., terminal) to adjust the peak value of the current of the first pulsating waveform may include the following operations. The control unit may send a fourth instruction to the device to be charged (e.g., a terminal) to inquire the present voltage of the battery of the device to be charged, e.g., a terminal. The control unit may receive, from the second adapter a reply instruction responsive to the fourth instruction; the reply instruction responsive to the fourth instruction may be configured to indicate the present voltage of the battery. Accordingly, the control unit may adjust the output current of the second adapter based on the present voltage of the battery.

Figure 19A:
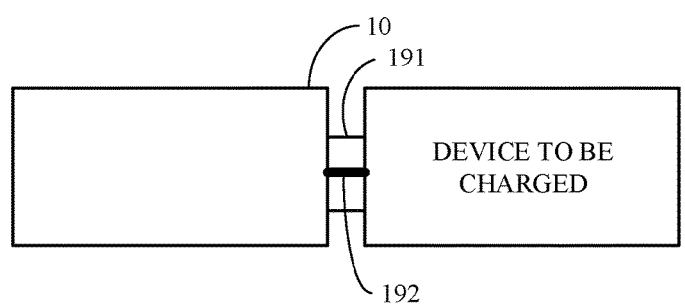
FIG. 19A is a schematic view illustrating a connection between a second adapter and a device to be charged in accordance with an embodiment.

In some embodiments, the second adapter 10 may include a charging interface 191, as illustrated in FIG. 19A. Further, in some embodiments, the control unit (e.g., the MCU of FIG. 23) in the second adapter 10 may perform two-way communication with the device to be charged (e.g., a terminal) via a data line 192 disposed in the charging interface 191.

In some embodiments, optionally, the control unit may perform two-way communication with the device to be charged (e.g., a terminal) to control the second adapter output in the second charging mode in the following manner. That is, the control unit may perform two-way communication with the device to be charged (e.g., a terminal) to determine whether the charging interface is in a poor contact.

As one implementation, the control unit may send a fourth instruction to the device to be charged (e.g., a terminal) to inquire the present voltage of the battery of the device to be charged, e.g., a terminal. The control unit may receive, from the device to be charged (e.g., a terminal) a reply instruction responsive to the fourth instruction; the reply instruction responsive to the fourth instruction is configured to indicate the present voltage of the battery of the device to be charged, e.g., a terminal. Accordingly, the control unit may determine whether the charging interface is in a poor contact based on the output voltage of the second adapter and the present voltage of the battery of the device to be charged, e.g., a terminal. For example, the control unit may determine that the difference between the output voltage of the second adapter and the present voltage of the device to be charged (e.g., a terminal) is greater than a predetermined voltage threshold, which may indicate that at this point the impedance obtained by dividing the voltage difference by the present output current value of the second adapter is larger than a predetermined impedance threshold, and therefore the charging interface will be determined as in a poor contact.

In some embodiments, whether the charging interface is in a poor contact may alternatively be determined by the device to be charged, e.g., a terminal. In particular, the device to be charged (e.g., a terminal) may send a sixth instruction to the control unit to inquire the output voltage of the second adapter. The device to be charged (e.g., a terminal) may receive from the control unit, a reply instruction responsive to the sixth instruction; the reply instruction responsive to the sixth instruction indicates the output voltage of the second adapter. Accordingly, the device to be charged (e.g., a terminal) may determine whether the charging interface is in a poor contact based on its present battery voltage in combination with the output voltage of the second adapter. After it determines that the charging interface is in a poor contact, the device to be charged (e.g., a terminal) may send a fifth instruction to the control unit to indicate that the charging interface is in a poor contact. The control unit may accordingly control the second adapter to quit the second charging mode after receiving the fifth instruction.

Figure 19B:
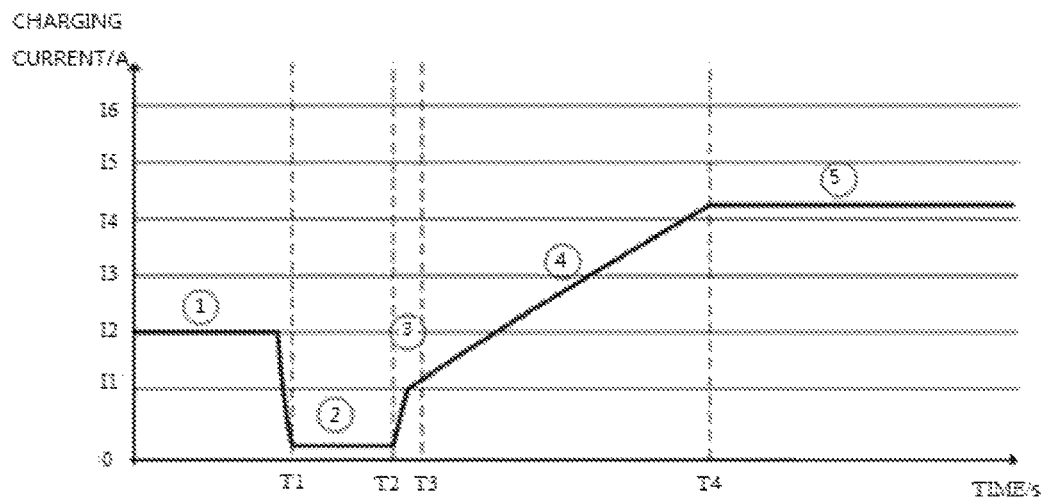
FIG. 19B is a schematic variation curve illustrating a quick charging communication process in accordance with an embodiment.

Hereinafter, the communication process between the control unit of the second adapter and the device to be charged (e.g., a terminal) will be described in further detail with reference to FIG. 19B. It however should be noted that the example of FIG. 19B is merely intended for the purpose of assisting a person of skill in the art in understanding the embodiments herein, rather than limiting the embodiments to the specific numerical values or scenarios described. It will be evident to those of skill in the art that various modifications or variations can be made based on the example illustrated in FIG. 19B, and all such modifications or variations shall all fall in the scope of the embodiments.

Referring now to FIG. 19B, the charging process of the device to be charged (e.g., a terminal) via the output of the second adapter in the second charging mode, may include five stages as follows.

Stage 1

After it is connected to a power supply, the device to be charged (e.g., a terminal) may detect the type of the power supply through data lines D+ and D−, and when the power supply is detected as a second adapter, the device to be charged (e.g., a terminal) may receive a current larger than a predetermined current threshold I2, e.g., 1 A. When the control unit of the second adapter detects that the output current of the second adapter is greater than or equal to I2 for a predetermined duration of time, e.g., a continuous period of time T1, the control unit may assume that the device to be charged (e.g., a terminal) has finished the type identification of the power supply. Thus, the control unit may start a negotiation procedure between the second adapter and the device to be charged (e.g., a terminal) and send Instruction 1 (corresponding to the above first instruction) to the device to be charged (e.g., a terminal) to inquire the device to be charged (e.g., a terminal) whether it agrees to be charged by the second adapter in the second charging mode.

When the control unit receives a reply instruction from the device to be charged (e.g., a terminal) in response to Instruction 1, and the reply instruction of the Instruction 1 indicates that the device to be charged (e.g., a terminal) does not agree to be charged by the second adapter in the second charging mode, then the control unit may redetect the output current of the second adapter. If the output current of the second adapter is still greater than or equal to I2 in a predetermined continuous duration of time, e.g., the continuous period of time T1, the control unit may again send another Instruction 1 to the device to be charged (e.g., a terminal) to inquire whether it agrees to be charged by the second adapter in the second charging mode. The control unit may repeatedly perform the above operations of stage 1 until the device to be charged (e.g., a terminal) agrees to be charged by the second adapter using the second charging mode, or until the output current of the second adapter no longer satisfies the condition of being greater than or equal to I2.

When the device to be charged (e.g., a terminal) agrees to be charged by the second adapter using the second charging mode, the communication process may proceed to a second stage.

Stage 2

The output voltage of the second adapter may include multiple levels. The control unit may send Instruction 2 (corresponding to the above second instruction) to the device to be charged (e.g., a terminal) to inquire whether the output voltage, i.e., the present output voltage, of the second adapter matches the present voltage of the battery of the device to be charged, e.g., a terminal.

The device to be charged (e.g., a terminal) may send a reply instruction responsive to the control unit in response to Instruction 2 to indicate that the output voltage of the second adapter is matching, high, or low in relation to the present voltage of the battery of the device to be charged, e.g., a terminal. If the reply instruction indicates the output voltage of the second adapter is high or low, the control unit may adjust the output voltage of the second adapter by one level, and then resend Instruction 2 to the device to be charged (e.g., a terminal) to re-inquire whether the output voltage of the second adapter matches the present voltage of the battery of the device to be charged, e.g., a terminal. The above operations of stage 2 will be repeatedly performed until the device to be charged (e.g., a terminal) replies that the output voltage of the second adapter matches the present voltage of the battery of the device to be charged (e.g., a terminal) and the communication process will then proceed to a third stage.

Stage 3

The control unit may send Instruction 3 (corresponding to the above third instruction) to the device to be charged (e.g., a terminal) to inquire the maximum charging current that is currently supported by the device to be charged, e.g., a terminal. The device to be charged (e.g., a terminal) may send a reply instruction responsive to the control unit in response to Instruction 3 to indicate the currently supported maximum charging current of the device to be charged, e.g., a terminal. The communication process will then proceed to a fourth stage.

Stage 4

The control unit may determine the charging current that is output from the second adapter in the second charging mode and is used to charge the device to be charged (e.g., a terminal) based on the currently supported maximum charging current of the device to be charged, e.g., a terminal. The communication process will then continue to a fifth stage, i.e., the constant-current charging stage.

Stage 5

After entering the constant-current charging stage, the second adapter may send Instruction 4 (corresponding to the above fourth instruction) to the device to be charged (e.g., a terminal) at regular intervals, to inquire the present voltage of the battery of the device to be charged, e.g., a terminal. The device to be charged (e.g., a terminal) may send a reply instruction responsive to the control unit in response to Instruction 4 to feed back the present voltage of the battery of the device to be charged, e.g., a terminal. The control unit may determine whether the charging interface is in a good contact and whether the output current of the second adapter needs to be reduced, based on the present voltage of the battery of the device to be charged, e.g., a terminal. When it determines that the charging interface is in a poor contact, the second adapter may send Instruction 5 (corresponding to the above fifth instruction) to the device to be charged (e.g., a terminal) and may quit the second charging mode and then reset to re-enter stage 1.

In some embodiments, the reply instruction sent by the device to be charged (e.g., a terminal) in response to Instruction 1 at stage 1 may carry the path impedance data or information of the device to be charged, e.g., a terminal. The path impedance data may be used to help determine at stage 5 whether the charging interface is in a good contact.

In some embodiments, at stage 2, the time it takes from the point when the device to be charged (e.g., a terminal) agrees to be charged by the second adapter in the second charging mode to the point when the control unit adjusts the output voltage of the second adapter to the suitable charging voltage can be controlled within a certain range. If the time exceeds a predetermined range, the second adapter or the device to be charged (e.g., a terminal) may determine that the quick charging communication process is abnormal, and then may reset to re-enter stage 1.

In some embodiments, when at stage 2 the output voltage of the second adapter is higher than the present voltage of the battery of the device to be charged (e.g., a terminal) by $\Delta V$, which can be set to the range of 200~500 mV, the device to be charged (e.g., a terminal) may send a reply instruction responsive to the control unit in response to Instruction 2 to indicate that the output voltage of the second adapter matches the battery voltage of the device to be charged, e.g., a terminal.

In some embodiments, optionally, at stage 4 the adjustment speed of the output current of the second adapter may be controlled within a certain range, so as to avoid an excessive adjustment speed from causing abnormal in the charging process of the device to be charged (e.g., a terminal) through the output of the second adapter in the second charging mode.

In some embodiments, the variation of the output current of the second adapter at stage 5 may be controlled within a degree of 5%.

In some embodiments, at stage 5, the control unit can monitor the path impedance of the charging circuit in real time. As one implementation, the control unit may monitor the path impedance of the charging circuit based on the output voltage and output current of the second adapter, as well as the present voltage of the battery fed back from the device to be charged, e.g., a terminal. When the "path impedance of the charging circuit" is larger than the sum of "the path impedance of the device to be charged (e.g., a terminal)" and "the path impedance of the charging cable", the charging interface may be determined as in a poor contact, such that the second adapter may stop charging the device to be charged (e.g., a terminal) in the second charging mode.

In some embodiments, after the second adapter enables the second charging mode to charge the device to be charged (e.g., a terminal), the communication time intervals between the control unit and the device to be charged (e.g., a terminal) can be controlled within a certain range, avoiding an exceedingly narrow communication interval from causing the communication process abnormal.

In some embodiments, the termination of the charging process, or to be more specific, the termination of the charging process of the device to be charged (e.g., a terminal) by the second adapter in the second charging mode, may be divided into a recoverable termination and an unrecoverable termination.

For example, when the battery of the device to be charged (e.g., a terminal) is detected as being fully charged or the charging interface is detected as in a poor contact, the charging process may be terminated and the charging communication process may be reset such that the charging process may re-enter stage 1. Then the device to be charged (e.g., a terminal) would not agree to be charged by the second adapter using the second charging mode, and therefore, the communication process will not proceed to stage 2. The termination of the charging process in this case is regarded as an unrecoverable termination.

In another example, when a communication abnormality occurs between the control unit and the device to be charged (e.g., a terminal), the charging process may be terminated, and the charging communication process may be reset such that the charging process may re-enter stage 1. After the requirements of stage 1 are satisfied, the device to be charged (e.g., a terminal) may agree to be charged by the second adapter in the second charging mode such that the charging process is restored. The termination of the charging process in this case may be regarded as a recoverable termination.

In yet another example, when the device to be charged (e.g., a terminal) detects that the battery is malfunctioning, the charging process may be terminated, and the charging communication process would be reset such that the charging process may re-enter stage 1. Then the device to be charged (e.g., a terminal) may not agree to be charged by the second adapter using the second charging mode. When the battery returns to normal and the requirements of stage 1 are satisfied, the device to be charged (e.g., a terminal) may then agree to be charged by the second adapter with the second charging mode. The termination of the quick charging process in this case may be regarded as a recoverable termination.

The above-described communication actions or operations illustrated in FIG. 19B are merely examples. For example, at stage 1, after the device to be charged (e.g., a terminal) is connected to the second adapter, the handshaking communication between the device to be charged (e.g., a terminal) and the control unit can also be initiated by the device to be charged (e.g., a terminal), namely the device to be charged (e.g., a terminal) may send Instruction 1 to inquire the control unit whether to enable the second charging mode. When the device to be charged (e.g., a terminal) receives a reply instruction from the control unit indicating that the control unit approves of the second adapter charging the device to be charged (e.g., a terminal) in the second charging mode, the second adapter may begin to charge the battery of the device to be charged (e.g., a terminal) in the second charging mode.

As another example, a constant-voltage charging stage may further be included subsequent to stage 5. In detail, at stage 5, the device to be charged (e.g., a terminal) may feed back to the control unit its present battery voltage. When the present voltage of the battery reaches the constant-voltage charging voltage threshold, the charging process would turn from the constant-current charging stage to the constant-voltage charging stage. In the constant-voltage charging stage, the charging current may gradually decrease and the entire charging process would be terminated when the charging current drops to a certain threshold, indicating that the battery of the device to be charged (e.g., a terminal) has been fully charged.

Figure 20:
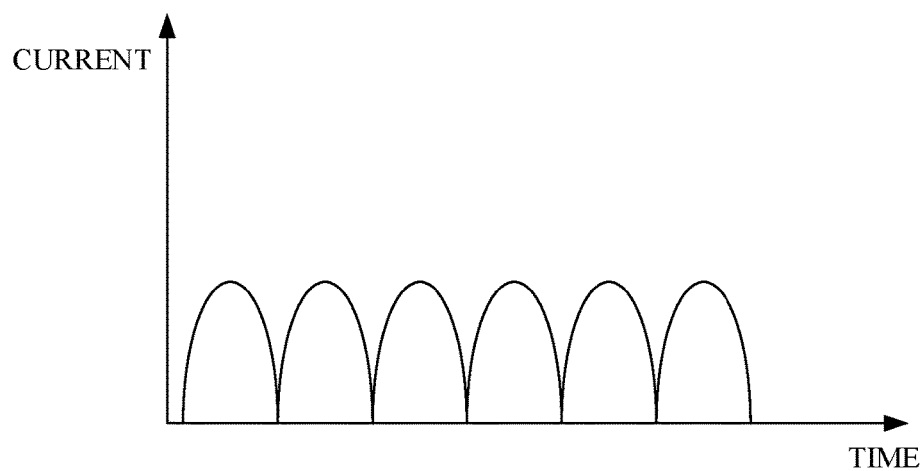
FIG. 20 is a schematic variation curve illustrating a current waveform of a pulsating direct current (DC).

In some embodiments, the output current of the second adapter may be a pulsating direct current (DC) (or called a unidirectional pulsating output current, a current having a pulsating waveform, or a steamed-bun shaped current). An example of the waveform of the pulsating DC is illustrated in FIG. 20.

As the output power of the second adapter becomes larger, lithium precipitation may occur in the battery of the device to be charged as the second adapter charges the battery, reducing the battery lifetime. To improve the battery reliability and safety, in the embodiments, the second adapter is controlled to output a pulsating DC which can reduce the probability and intensity of arc charging at contact points of the charging interface, thus increasing the lifetime of the charging interface. The output current of the second adapter can be set to the pulsating DC in various manners. For example, the secondary filter unit can be removed from power converting unit 11 and the secondary current can be rectified and directly output to generate the pulsating DC.

Figure 21:
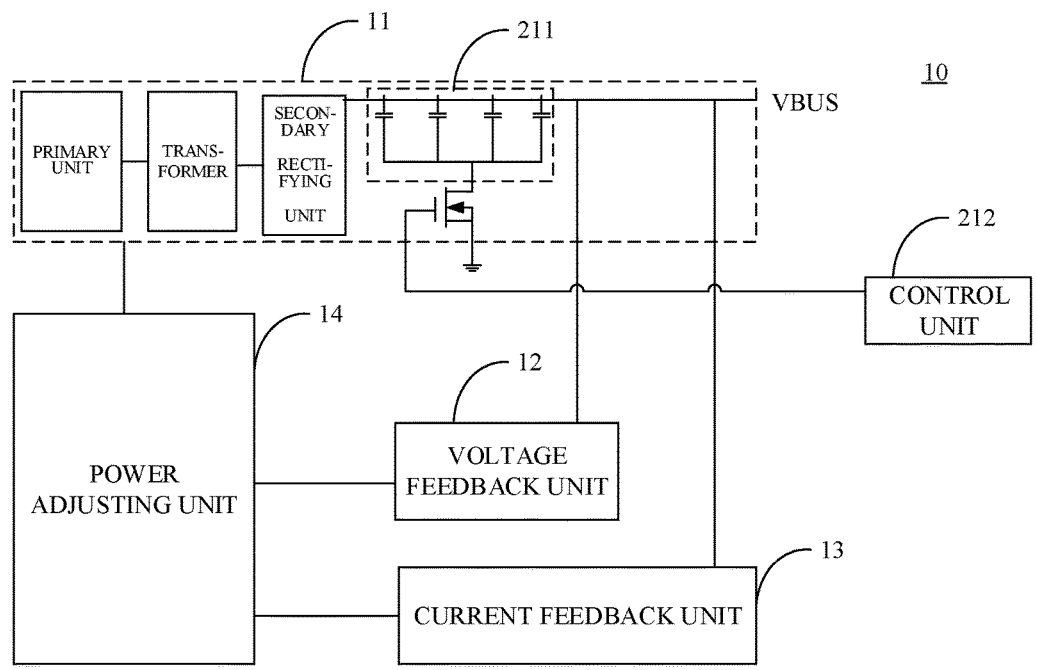
FIG. 21 is a block diagram illustrating a second adapter in accordance with still another embodiment.

Furthermore, on basis of any of the above embodiments, the second adapter 10 is operable in a first charging mode and a second charging mode, as illustrated in FIG. 21, where the speed of the second adapter charging the device to be charged (e.g., a terminal) in the second charging mode may be faster than that in the first charging mode. Power converting unit 11 may include a secondary filter unit 211 while the second adapter 10 may include a control unit 212 that is coupled to the secondary filter unit 211. In the first charging mode, the control unit 212 may control the secondary filter unit 211 to operate to make the voltage value of the output voltage of second adapter 10 stable. In the second charging mode, the control unit 212 may control the secondary filter unit 211 to stop operating such that the output current of the second adapter 10 would become a pulsating DC.

In the embodiments, the control unit can control the secondary filter unit to operate or not operate such that the second adapter can output a common DC having a constant current value or a pulsating DC having a varying current value, thereby accommodating the existing charging mode.

In some embodiments, second adapter 10 is operable in a second charging mode which is a constant-current mode. In the second charging mode, the output current of the second adapter may be an alternating current (AC) which can also reduce the occurrence of lithium precipitation in the lithium battery and thus can extend the battery lifetime.

In some embodiments, the second adapter 10 is operable in a second charging mode which may be a constant-current mode. In the second charging mode, the output voltage and output current of the second adapter can be directly applied to both ends of the battery of the device to be charged (e.g., a terminal) so as to direct-charge the battery.

The term "direct-charge" may refer to directly applying the output voltage and output current of the second adapter to both ends of the device to be charged (e.g., a terminal) to charge the battery of the device to be charged (e.g., a terminal) without the need of intermediate conversion circuit to convert the output voltage and output current of the second adapter, thus avoiding energy loss caused by the conversion process. In order to be able to adjust the charging voltage or charging current on the charging circuit during the charging process in the second charging mode, the second adapter can be designed as an intelligent adapter to accomplish the conversion of the charging voltage or charging current, so as to reduce the burden on the device to be charged (e.g., a terminal) and to reduce the amount of heat produced by the device to be charged (e.g., a terminal).

The constant-current mode herein refers to the charging mode that controls the output current of the second adapter, and should not be interpreted as requiring the output current of the second adapter remain constant. In practice, the second adapter normally may adopt a multi-stage constant-current manner for charging under the constant-current mode.

The multi-stage constant-current charging may include a number of N charging stages, where N is an integer not smaller than 2. The multi-stage constant-current charging may begin with a first stage using a predetermined charging current. Of the N charging stages of the multi-stage constant-current charging, the first stage through the $(N-1)^{th}$ stage may be sequentially performed, where when the charging turns from a previous charging stage to a next charging stage, the charging current value may become smaller, and, in addition, when the battery voltage reaches a corresponding charging cut-off voltage threshold, the charging may proceed from the previous charging stage to the next charging stage.

Figure 22:
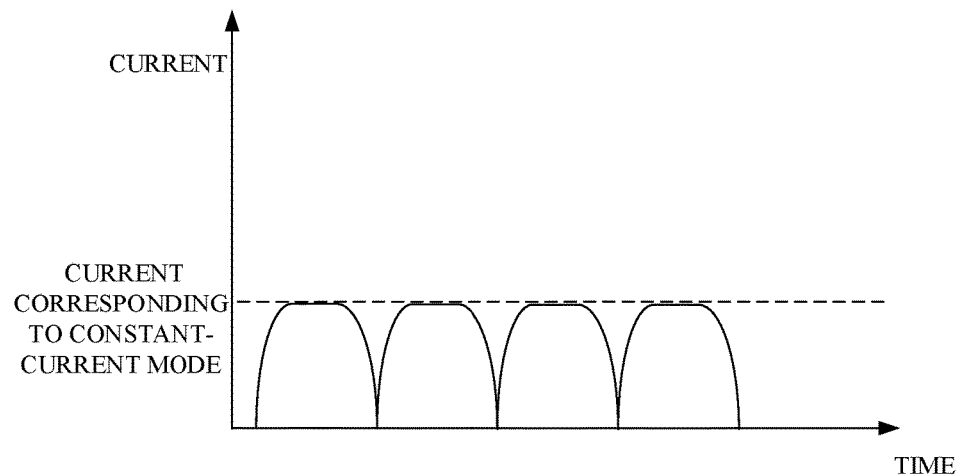
FIG. 22 is schematic variation curve illustrating a pulsating DC in a constant-current mode in accordance with an embodiment.

Further, in the case where the output current of the second adapter is a pulsating DC, the constant-current mode may refer to a charging mode in which the peak or mean value of the pulsating DC is controlled, namely the peak value of the output current of the second adapter may be controlled to not exceed the current corresponding to the constant-current mode, as illustrated in FIG. 22. In addition, in the case where the output current of the second adapter is an AC current, the constant-current mode may refer to a charging mode in which the peak value of the AC current is controlled.

Figure 23:
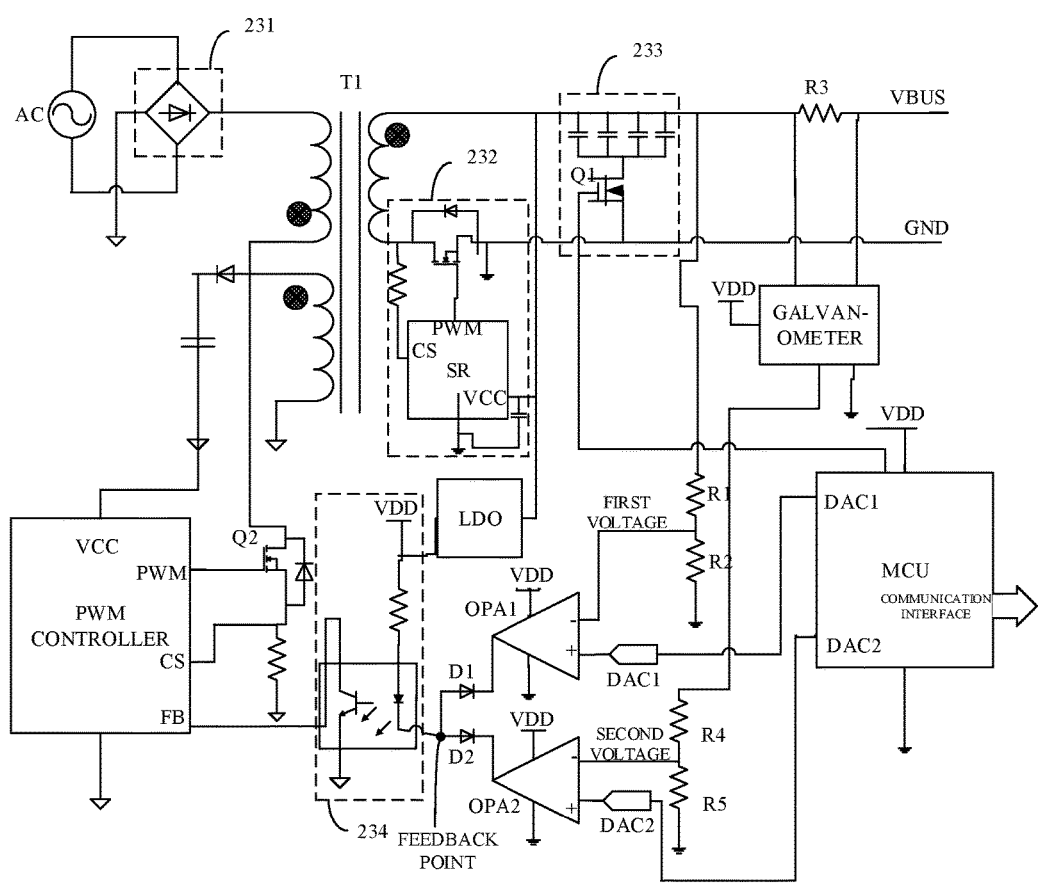
FIG. 23 is a circuit diagram of a second adapter in accordance with an embodiment.

Hereinafter, embodiments of the disclosure will be described in more detail with examples. However, it should be noted that the example of FIG. 23 is merely intended for the purpose of assisting a person skilled in the art in understanding the embodiments herein, rather than limiting the embodiments to specific numerical values or scenarios described. It will be evident to those skilled in the art that various modifications or variations can be made based on the example of FIG. 23, without departing from the spirit and scope of the embodiments.

The second adapter may include a power converting unit (corresponding to the above power converting unit 11). As illustrated in FIG. 23, the power converting unit may include an AC input end, a primary rectifying unit 231, a transformer T1, a secondary rectifying unit 232, and a secondary filter unit 233.

The AC input end may have mains current (typically an AC current of 220V) input and then transfer the mains current to the primary rectifying unit 231.

The primary rectifying unit 231 may be configured to convert the mains current to a first pulsating DC and transfer the first pulsating DC to the transformer T1. The primary rectifying unit 231 may be a bridge rectifying unit, e.g., a full-bridge rectifying unit as illustrated in FIG. 23, or a half-bridge rectifying unit, but the embodiments are not limited thereto.

A related adapter generally includes at its primary side a primary filter unit that typically uses a liquid aluminum electrolytic capacitor for filtering, but the relatively large volume of the liquid aluminum electrolytic capacitor will result in a relatively large dimension of the adapter. In contrast, the second adapter provided by embodiments herein does not include a primary filter unit at its primary side such that the volume of the second adapter can be largely reduced.

The transformer T1 may be configured to couple the first pulsating DC from the primary side to the secondary side of the transformer to obtain a second pulsating DC. The second pulsating DC may further be output by a secondary winding of the transformer T1. The transformer T1 may be a normal transformer, or a high-frequency transformer having an operating frequency in the range of 50 KHz-2 MHz. The number and connection manner of primary windings of the transformer T1 are related to the type of a switching power supply used in the second adapter, but they will not be limited herein. For example, the second adapter may use a fly-back switching power supply, as illustrated in FIG. 23. The transformer's primary winding may include one end coupled to the primary rectifying unit 231 and another end coupled to a switch that is under control of a PWM controller. The second adapter may of course also use a forward switching power supply or a push-pull switching power supply. Different types of switching power supplies will have their respective connection manners between the primary rectifying unit and the transformer, which are not to be enumerated for simplicity purposes.

The secondary rectifying unit 232 may be configured to rectify the second pulsating DC output from the secondary winding of the transformer T1 to obtain a third pulsating DC. The secondary rectifying unit 232 can be of multiple types and FIG. 23 shows a typical secondary synchronous rectification circuit that includes a synchronous rectifier (SR) chip, a metal oxide semiconductor (MOS) transistor controlled by the SR chip, and a diode connected between the source and drain of the MOS transistor. The SR chip may transmit a PWM control signal to the gate of the MOS transistor to control the ON/OFF of the MOS transistor, thus achieving synchronous rectification at the secondary side.

The secondary filter unit 233 may be configured to rectify the output second pulsating DC of the secondary rectifying unit 232 to obtain the output voltage and output current of the second adapter, that is, the voltage across and current through two ends of VBUS and GND as illustrated in FIG. 23). In the embodiment of FIG. 23, the capacitor(s) in the secondary filter unit 233 may be implemented as one or more solid-state capacitors, or as one or more solid-state capacitors connected in parallel with conventional capacitor (s) such as a ceramic capacitor, for the purpose of filtering.

Further, the secondary filter unit 233 may further include a switch component, such as the switch transistor Q1 illustrated in FIG. 23. The switch transistor Q1 may receive a control signal from the MCU. When the MCU controls the switch transistor Q1 to switch on, the secondary filter unit 233 may start to operate such that the second adapter would operate in the first charging mode. In the first charging mode, the second adapter may have an output voltage of 5V and an output current that is a smooth DC current. When the MCU controls the switch transistor Q1 to switch off, the secondary filter unit 233 may stop operating thus causing the second adapter to operate in the second charging mode. In the second charging mode, the second adapter may directly output the pulsating DC obtained by the rectification of the secondary rectifying unit 232.

Furthermore, the second adapter may include a voltage feedback unit (corresponding to the foregoing voltage feedback unit 12). As illustrated in FIG. 23, the voltage feedback unit may include a resistor R1, a resistor R2, and a first op-amp OPA1.

More particularly, the resistors R1 and R2 may sample the output voltage of the second adapter, that is, the voltage on VBUS, to obtain a first voltage, and then transfer the sampled first voltage to a reversed-phase input end of the first op-amp OPA1, so as to indicate the magnitude of the output voltage of the second adapter. The in-phase input end of the first op-amp OPA1 may be coupled to the DAC1 port of the MCU through the DAC1. The MCU may adjust the reference voltage (corresponding to the first reference voltage described above) of the first op-amp OPA1 by controlling the magnitude of the output analog quantity of DAC1, so as to further adjust a corresponding target voltage value of the voltage feedback unit.

Furthermore, the second adapter may include a current feedback unit (corresponding to the foregoing current feedback unit 13). As illustrated in FIG. 23, the current feedback unit may include a resistor R3, a galvanometer, a resistor R4, a resistor R5, and a second op-amp OPA2.

The resistor R3 may be a current sensing resistor. The galvanometer may detect the current flowing through resistor R3 to obtain the output current of the second adapter, and convert the output current into a corresponding voltage value to output to both ends of resistor R4 and R5 for voltage division, so as to obtain a second voltage that can indicate the magnitude of the output current of the second adapter. The reversed-phase input end of the second op-amp OPA2 may be configured to receive the second voltage. The in-phase input end of the second op-amp OPA2 may be coupled to the DAC2 port of the MCU through the DAC2. The MCU may adjust the reference voltage (corresponding to the second reference voltage described above) of the second op-amp OPA2 by controlling the magnitude of the output analog quantity of the DAC2 so as to further adjust the corresponding target current value of the current feedback unit.

The second adapter may further include a power adjusting unit (corresponding to the foregoing power adjusting unit 14). As illustrated in FIG. 23, the power adjusting unit may include a first diode D1, a second diode D2, a photoelectric coupling unit 234, a PWM controller, and a switch transistor Q2.

In one implementation, the first diode D1 and the second diode D2 may be connected in reverse parallel. Anodes of the first diode D1 and the second diode D2 may be coupled to the feedback point illustrated in FIG. 23. Photoelectric coupling unit 234 may include an input end configured to receive a voltage signal at the feedback point. When the voltage at the feedback point is lower than the operating voltage VDD of the photoelectric coupling unit 234, the photoelectric coupling unit 234 may start to operate to supply a feedback voltage to an FB (feedback) end of the PWM controller. The PWM controller may accordingly control the duty ratio of a PWM signal output from the PWM end by comparing the voltages at the CS end and FB end. When the output voltage signal of the first op-amp OPA1, i.e., the foregoing voltage feedback signal, equals "0", or when the output voltage signal of the second op-amp OPA2, i.e., the above current feedback signal, equals "0", a stable voltage would be present at the FB end and so the PWM control signal output from the PWM end of the PWM controller would retain a certain duty ratio. The PWM end of the PWM controller may be coupled to the primary winding of the transformer T1 through the switch transistor Q2 to control the output voltage and output current of the second adapter. When the duty ratio of the control signal sent out from the PWM end keeps constant, the output voltage and output current of the second adapter will remain stable.

Furthermore, the second adapter of FIG. 23 may further include a first adjusting unit and a second adjusting unit. As illustrated in FIG. 23, the first adjusting unit may include an MCU (corresponding to the above control unit) and a DAC1 to adjust the value of the reference voltage of the first op-amp OPA1 so as to further adjust the value of the corresponding target voltage of the voltage feedback unit. The second adjusting unit may include an MCU (corresponding to the above control unit) and a DAC2 to adjust the value of the reference voltage of the second op-amp OPA2 so as to further adjust the value of the corresponding target current of the current feedback unit.

The MCU can adjust the target voltage value and the target current value based on the charging mode currently used by the second adapter. For example, when the second adapter uses the constant-voltage mode for charging, the target voltage may be adjusted to the voltage corresponding to the constant-voltage mode and the target current may be adjusted to the maximum current allowed to output in the constant-voltage mode. In another example, when the second adapter uses a constant-current mode for charging, the target current can be adjusted to a current corresponding to the constant-current mode and the target voltage can be adjusted to the allowed maximum output voltage under the constant-current mode.

For example, in the constant-voltage mode, the target voltage may be adjusted to a fixed voltage value, e.g., 5V. Considering there is no primary filter unit provided at the primary side (in the embodiments of the present disclosure, the primary filter unit, which uses a liquid aluminum electrolytic capacitor having a relatively large volume, has been removed to reduce the dimension of the second adapter) and that the secondary filter unit 233 has limited load capacity, the target current can be set to 500 mA or 1 A. The second adapter may first adjust its output voltage to 5V based on the voltage feedback loop. Once the output current of the second adapter reaches the target current, the second adapter may make use of a current feedback loop to control the output current of the second adapter to not exceed the target current. In the constant-current mode, the target current may be set to 4A and the target voltage may be set to 5V. Since the output current of the second adapter is a pulsating DC, the current higher than 4 A can be peak clipped through the current feedback loop to maintain the current peak of the pulsating DC at 4 A. Once the output voltage of the second adapter exceeds the target voltage, the output voltage of the second adapter can be controlled to not exceed the target voltage through the voltage feedback loop.

In addition, the MCU may also include a communication interface, through which the MCU can perform two-way communication with the device to be charged (e.g., a terminal) to control the charging process of the second adapter. In the case where the charging interface is a USB interface, the communication interface may also be a USB interface. In particular, the second adapter may use the power line in the USB interface to charge the device to be charged (e.g., a terminal) and use the data lines (D+ and/or D−) in the USB interface to communicate with the device to be charged, e.g., a terminal.

In addition, the photoelectric coupling unit 234 may be coupled to a voltage regulating unit to stabilize the operating voltage of the optocoupler. As illustrated in FIG. 23, the voltage regulating unit in the embodiments may be implemented as a low dropout regulator (LDO).

In FIG. 23 an example is illustrated in which the control unit (MCU) adjusts the reference voltage of the first op-amp OPA1 via the DAC1, where the reference voltage is adjusted in a manner corresponding to that in which the reference voltage of FIG. 4 is adjusted, but embodiments of the disclosure are not limited thereto, for example, any of the reference voltage adjustment modes as depicted in FIG. 5 to FIG. 8 may be used, which are not to be detailed herein for sake of simplicity.

FIG. 23 also illustrates an example in which the control unit (MCU) adjusts the reference voltage of the second op-amp OPA2 via the DAC2, where the reference voltage is adjusted in a manner corresponding to that in which the reference voltage of FIG. 12 is adjusted, but embodiments of the disclosure are not limited thereto, for example, any of the reference voltage adjustment modes as depicted in FIG. 13 to FIG. 16 may be used, which are not to be detailed herein, for sake of simplicity.

Apparatus embodiments of the present disclosure have been described above in detail with reference to FIG. 1 to FIG. 23. Hereinafter, method embodiments of the disclosure will be detailed in connection with FIG. 24. It should be noted that, the description made with regard to the method will correspond to the above description of the apparatus and so the overlapping description is properly omitted for simplicity purposes.

Figure 24:
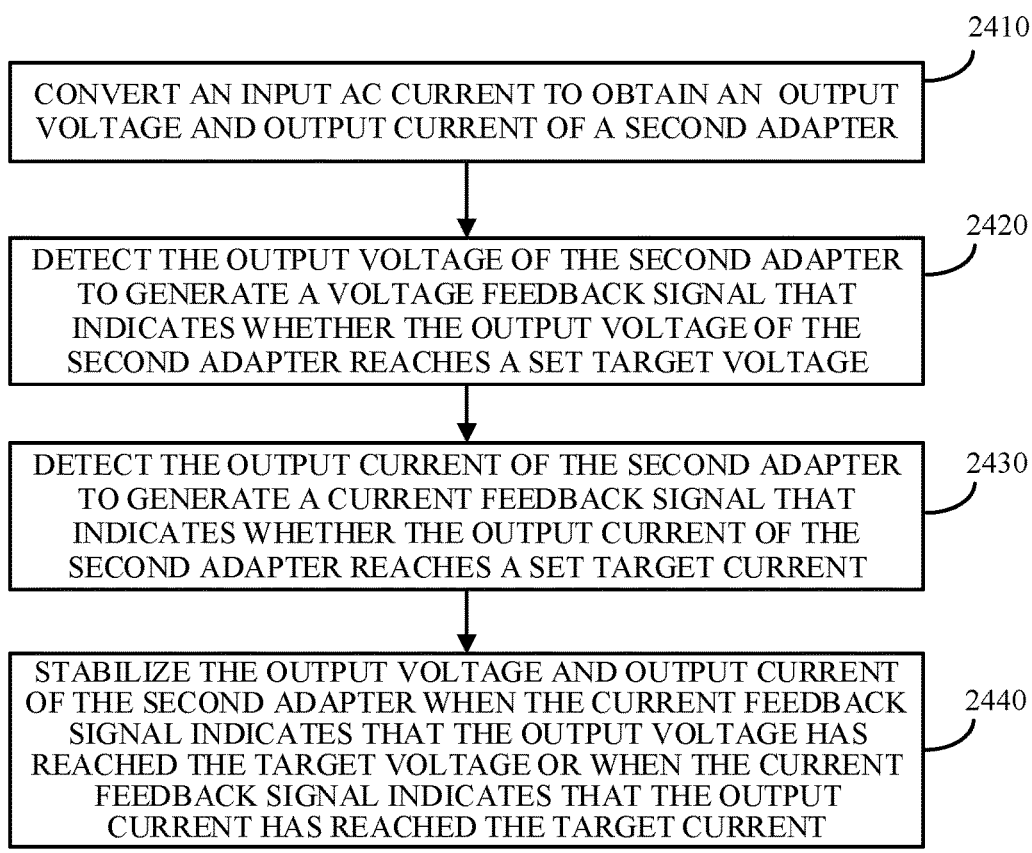
FIG. 24 is a flowchart illustrating a method for charging control in accordance with an embodiment.

FIG. 24 is a flowchart illustrating a method for charging control in accordance with an embodiment. The charging method of FIG. 24 may be implemented by the foregoing second adapter 10 and may include the following actions.

In 2410, an input AC current is converted to obtain an output voltage and output current of the second adapter.

In 2420, the output voltage of the second adapter is detected to generate a voltage feedback signal that indicates whether the output voltage of the second adapter reaches a preset target voltage.

In 2430, the output current of the second adapter is detected to generate a current feedback signal that indicates whether the output current of the second adapter reaches a preset target current.

In 2440, the output voltage and output current of the second adapter are stabilized when the voltage feedback signal indicates the output voltage of the second adapter has reached the target voltage or when the current feedback signal indicates the output current of the second adapter has reached the target current.

In some embodiments, the second adapter is operable in a first charging mode which is a constant-voltage mode. In the constant-voltage mode, the target voltage may be a voltage corresponding to the constant-voltage mode and the target current may be the maximum current that is allowed to output by the second adapter under the constant-voltage mode. The method of FIG. 24 may further include adjusting the output voltage of the second adapter to the voltage corresponding to the constant-voltage mode based on the voltage feedback signal. Action 2440 may include controlling the output current of the second adapter to not exceed the allowed maximum output current of the second adapter under the constant-voltage mode, when the current feedback signal indicates the output current of the second adapter has reached the allowed maximum output current of the second adapter under the constant-voltage mode.

In some embodiments, the second adapter may include a primary rectifying unit, a transformer, a secondary rectifying unit, and a secondary filter unit. The primary rectifying unit may directly output a voltage of a pulsating waveform (also a pulsating voltage) to the transformer.

In some embodiments, the allowed maximum output current of the second adapter under the constant-voltage mode may be determined based on the capacitance of capacitor(s) in the secondary filter unit.

In some embodiments, the second adapter is operable in a second charging mode which is a constant-current mode. In the constant-current mode, the target voltage is the maximum voltage that the second adapter is able to output in the constant-current mode, while the target current is a current corresponding to the constant-current mode. The method of FIG. 24 may further include adjusting the output current of the second adapter to the current corresponding to the constant-current mode based on the current feedback signal. Action 2440 may include controlling the output voltage of the second adapter to not exceed the allowed maximum output voltage of the second adapter under the constant-current mode, when the voltage feedback signal indicates the output voltage of the second adapter has reached the allowed maximum output voltage of the second adapter under the constant-current mode.

In some embodiments, the method of FIG. 24 may further include adjusting the value of the target voltage.

In some embodiments, the second adapter is operable in a first charging mode and a second charging mode, and adjusting the target voltage value may include adjusting the value of the target voltage based on the first charging mode or second charging mode currently used by the second adapter.

In some embodiments, detecting the output voltage of the second adapter to generate the voltage feedback signal may include: sampling the output voltage of the second adapter to obtain a first voltage; comparing the first voltage against a first reference voltage; generating the voltage feedback signal based on the comparison between the first voltage and the first reference voltage. Adjusting the value of the target voltage may include adjusting the value of the first reference voltage to adjust the value of the target voltage.

In some embodiments, the value of the first reference voltage may be adjusted through a first DAC.

In some embodiments, the value of the first reference voltage may be adjusted through an RC filter unit.

In some embodiments, the value of the first reference voltage may be adjusted through a digital potentiometer.

In some embodiments, detecting the output voltage of the second adapter to generate the voltage feedback signal may include: dividing the output voltage of the second adapter according to a preset voltage division ratio to obtain a first voltage; comparing the first voltage against a first reference voltage; and generating the voltage feedback signal based on the comparison between the first voltage and the first reference voltage. Adjusting the target voltage value may include adjusting the voltage division ratio to adjust the voltage value of the target voltage.

In some embodiments, the voltage division ratio is a voltage division ratio of a digital potentiometer.

In some embodiments, the method of FIG. 24 may further include adjusting the current value of the target current.

In some embodiments, the second adapter is operable in a first charging mode and a second charging mode. Adjusting the current value of the target current may include adjusting the target current value based on the first charging mode or second charging mode currently used by the second adapter.

In some embodiments, detecting the output current of the second adapter to generate the current feedback signal may include: sampling the output current of the second adapter to obtain a second voltage that indicates the magnitude of the output current of the second adapter; comparing the second voltage against a second reference voltage; and generating the current feedback signal based on the comparison between the second voltage and the second reference voltage. Adjusting the current value of the target current may include adjusting the voltage value of the second reference voltage to adjust the current value of the target current.

In some embodiments, the value of the second reference voltage may be adjusted through a second DAC.

In some embodiments, the value of the second reference voltage may be adjusted through an RC filter unit.

In some embodiments, the value of the second reference voltage may be adjusted through a digital potentiometer.

In some embodiments, detecting the output current of the second adapter to generate the current feedback signal may include: sampling the output current of the second adapter to obtain a third voltage that indicates the magnitude of the output current of the second adapter; dividing the third voltage according to a set voltage division ratio to obtain a second voltage; comparing the second voltage against a second reference voltage; and generating the current feedback signal based on the comparison between the second voltage and the second reference voltage. Adjusting the current value of the target current may include adjusting the voltage division ratio to adjust the current value of the target current.

In some embodiments, the voltage division ratio is a voltage division ratio of a digital potentiometer.

In some embodiments, the second adapter is operable in a first charging mode and a second charging mode. The charging speed of the device to be charged by the second adapter in the second charging mode may be faster than in the first charging mode. Furthermore, when the second adapter is connected with the device to be charged, in the method of FIG. 24, the second adapter may perform two-way communication with the device to be charged to control the second adapter to output in the second charging mode.

In some embodiments, performing two-way communication with the device to be charged to control the second adapter to output in the second charging mode may include performing two-way communication with the device to be charged to negotiate a charging mode between the second adapter and the device to be charged.

In some embodiments, performing two-way communication with the device to be charged to negotiate the charging mode may include: sending a first instruction to the device to be charged to inquire the device to be charged whether to enable the second charging mode; receiving a reply instruction, from the device to be charged in response to the first instruction, where the reply instruction responsive to the first instruction indicates whether the device to be charged agrees to enable the second charging mode; using the second charging mode to charge the device to be charged when the device to be charged agrees to enable the second charging mode.

In some embodiments, performing two-way communication with the device to be charged to control the second adapter to output in the second charging mode includes: performing two-way communication with the device to be charged to determine the charging voltage that is output from the second adapter in the second charging mode and is used to charge the device to be charged; adjusting the voltage value of the target voltage to be equal to the charging voltage that is output from the second adapter in the second charging mode and is used to charge the device to be charged.

In some embodiments, performing two-way communication with the device to be charged to determine the charging voltage that is output from the second adapter in the second charging mode and is used to charge the device to be charged may include: sending a second instruction to the device to be charged to inquire whether the output voltage of the second adapter matches the present voltage of the battery of the device to be charged; receiving a reply instruction, from the device to be charged in response to the second instruction, and the reply instruction responsive to the second instruction indicates whether the output voltage of the second adapter is matching, high, or low relative to the present voltage of the battery.

In some embodiments, performing two-way communication with the device to be charged to control the second adapter to output in the second charging mode may include: performing two-way communication with the device to be charged to determine the charging current that is output by the second adapter in the second charging mode and is used to charge the device to be charged; adjusting the current value of the target current to be equal to the charging current that is output by the second adapter in the second charging mode and is used to charge the device to be charged.

In some embodiments, performing two-way communication with the device to be charged to determine the charging current that is output by the second adapter in the second charging mode and is used to charge the device to be charged may include: sending a third instruction to the device to be charged to inquire the maximum charging current currently supported by the device to be charged; receiving a reply instruction, from the device to be charged in response to the third instruction, and the reply instruction responsive to the third instruction indicates the maximum charging current currently supported by the device to be charged; determining the charging current that is output by the second adapter in the second charging mode and is used to charge the device to be charged based on the maximum charging current the device to be charged currently supports.

In some embodiments, performing two-way communication with the device to be charged to control the second adapter to output in the second charging mode may include performing two-way communication with the device to be charged to adjust the output current of the second adapter during the charging process in the second charging mode.

In some embodiments, performing two-way communication with the device to be charged to adjust the output current of the second adapter may include: sending a fourth instruction to the device to be charged to inquire the present voltage of the battery of the device to be charged; receiving a reply instruction, in response to the fourth instruction from the second adapter, that indicates the present voltage of the battery; adjusting the output current of the second adapter based on the present voltage of the battery.

In some embodiments, the second adapter may include a charging interface. The second adapter may perform two-way communication with the device to be charged through a data line in the charging interface.

In some embodiments, the second adapter is operable in a second charging mode which may be a constant-current mode, and in the second charging mode the output current of the second adapter may be a pulsating DC.

In some embodiments, the second adapter is operable in a first charging mode which may be a constant-voltage mode. The second adapter may include a secondary filter unit, and the method of FIG. 24 may further include: controlling in the first charging mode the secondary filter unit to operate such that the output voltage of the second adapter keeps constant; controlling in the second charging mode the secondary filter unit to stop operating such that the output current of the second adapter would become a pulsating DC.

In some embodiments, the second adapter is operable in a second charging mode which may be a constant-current mode, and in the second charging mode the output current of the second adapter may be an AC current.

In some embodiments, the second adapter is operable in a second charging mode. In the second charging mode the output voltage and output current of the second adapter can be directly applied to both ends of the battery of the device to be charged so as to direct-charge the battery.

In some embodiments, the second adapter may be an adapter configured to charge a mobile device to be charged.

In some embodiments, the second adapter may include a control unit that controls the charging process. The control unit may be an MCU.

In some embodiments, the second adapter may include a charging interface which may be a USB interface.

It will be appreciated that the use of terms "first adapter" and "second adapter" is for purposes of illustration only and not of limiting the type of the adapter of the embodiments.

Those of ordinary skill in the art will appreciate that units (including sub-units) and algorithmic operations of various examples described in connection with embodiments herein can be implemented by electronic hardware or by a combination of computer software and electronic hardware. Whether these functions are performed by means of hardware or software depends on the application and the design constraints of the associated technical solution. A professional technician may use different methods with regard to each particular application to implement the described functionality, but such methods should not be regarded as lying beyond the scope of the disclosure.

It will be evident to those skilled in the art that the corresponding processes of the above method embodiments can be referred to for the working processes of the foregoing systems, apparatuses, and units, for purposes of convenience and simplicity.

It will be appreciated that the systems, apparatuses, and methods disclosed in embodiments herein may also be implemented in various other manners. For example, the above apparatus embodiments are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure.

Additionally, various functional units (including sub-units) described in embodiments herein may be integrated into one processing unit or may be present as a number of physically separated units, and two or more units may be integrated into one.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various embodiments. The above storage medium may include various kinds of media that can store program code, such as a USB flash disk, a mobile hard drive, a read-only memory (ROM), a random access memory (RAM), a magnetic disk, or an optical disk.

The foregoing description merely depicts some exemplary embodiments of the disclosure and therefore is not intended as limiting the scope of the present disclosure. Any variations or substitutions that can be readily thought of by any persons skilled in the art based on the scope of the present disclosure shall all be covered within the protection of the present disclosure. Therefore, the scope of the present disclosure is only defined by the appended claims.

What is claimed is:
1. An adapter comprising:
a power converting unit, configured to convert an input alternating current (AC) to obtain an output voltage and an output current of the adapter;
a voltage feedback unit, having an input end coupled to the power converting unit, and configured to detect the output voltage of the adapter to generate a voltage feedback signal, the voltage feedback signal being configured to indicate whether the output voltage of the adapter reaches a target voltage;
a current feedback unit, having an input end coupled to the power converting unit, and configured to detect the output current of the adapter to generate a current feedback signal, the current feedback signal being configured to indicate whether the output current of the adapter reaches a target current;

a power adjusting unit, having an input end coupled to an output end of the voltage feedback unit and to an output end of the current feedback unit, and an output end coupled to the power converting unit, the power adjusting unit being configured to receive the voltage feedback signal and the current feedback signal and stabilize the output voltage and the output current of the adapter when the voltage feedback signal indicates the output voltage of the adapter has reached the target voltage or when the current feedback signal indicates the output current of the adapter has reached the target current;

a charging interface, having a data line configured to be used by the adapter to perform two-way communication with a device to be charged; and a second adjusting unit coupled to the current feedback unit and configured to adjust a current value of the target current; wherein the current feedback unit comprises:
  a current sampling unit, having an input end coupled to the power converting unit, and configured to sample the output current of the adapter to obtain a third voltage, the third voltage being configured to indicate a magnitude of the output current of the adapter;
  a voltage dividing unit, having an input end coupled to an output end of the current sampling unit, and configured to divide the third voltage according to a voltage division ratio to obtain a second voltage; and
  a current comparing unit, having an input end coupled to an output end of the voltage dividing unit, and configured to compare the second voltage against a second reference voltage and generate the current feedback signal based on comparison between the second voltage and the second reference voltage, wherein the second adjusting unit is coupled to the voltage dividing unit and configured to adjust the voltage division ratio of the voltage dividing unit to adjust the current value of the target current.

2. The adapter of claim 1, wherein the adapter further comprises a first adjusting unit coupled to the voltage feedback unit to adjust a value of the target voltage.

3. The adapter of claim 2, wherein the voltage feedback unit comprises:
  a voltage dividing unit, having an input end coupled to the power converting unit, and configured to divide the output voltage of the adapter according to a voltage division ratio to obtain a first voltage; and
  a voltage comparing unit, having an input end coupled to an output end of the voltage dividing unit, and configured to compare the first voltage against a first reference voltage and generate the voltage feedback signal based on comparison between the first voltage and the first reference voltage, wherein the first adjusting unit is coupled to the voltage dividing unit and configured to adjust the voltage division ratio of the voltage dividing unit to adjust the value of the target voltage.

4. The adapter of claim 3, wherein the voltage dividing unit comprises a digital potentiometer and the first adjusting unit comprises a control unit, and wherein
  the digital potentiometer has a high-potential end coupled to the power converting unit, a low-potential end grounded, and an output end coupled to an input end of the voltage comparing unit; and
  the control unit is coupled to a control end of the digital potentiometer and configured to adjust a voltage division ratio of the digital potentiometer.

5. The adapter of claim 3, wherein the voltage comparing unit comprises a first operational amplifier (op-amp) having a reversed-phase input end configured to receive the first voltage, an in-phase input end configured to receive the first reference voltage, and an output end configured to generate the voltage feedback signal.

6. The adapter of claim 2, wherein the adapter is operable in a first charging mode and a second charging mode, and the first adjusting unit is operative to adjust the value of the target voltage based on the first charging mode or the second charging mode currently used by the adapter.

7. The adapter of claim 1, wherein the voltage dividing unit comprises a digital potentiometer and the second adjusting unit comprises a control unit, and wherein
  the digital potentiometer has a high-potential end coupled to the output end of the current sampling unit, a low-potential end grounded, and an output end coupled to the input end of the current comparing unit; and
  the control unit is coupled to a control end of the digital potentiometer and configured to adjust the voltage division ratio of the digital potentiometer.

8. The adapter of claim 1, wherein the current comparing unit comprises a second operational amplifier (op-amp) having a reversed-phase input end configured to receive the second voltage, an in-phase input end configured to receive the second reference voltage, and an output end configured to generate the current feedback signal.

9. The adapter of claim 1, wherein the adapter is operable in a first charging mode and a second charging mode, and the second adjusting unit is operative to adjust the current value of the target current based on the first charging mode or the second charging mode currently used by the adapter.

10. The adapter of claim 1, wherein the adapter is operable in a first charging mode which is a constant-voltage mode, and wherein in the constant-voltage mode, the target voltage is a voltage corresponding to the constant-voltage mode and the target current is the maximum current that the adapter is able to output under the constant-voltage mode; and
  the power adjusting unit is configured to adjust the output voltage of the adapter to the voltage corresponding to the constant-voltage mode based on the voltage feedback signal, and configured to control the output current of the adapter to not exceed the maximum current that the adapter is able to output in the constant-voltage mode when the current feedback signal indicates the output current of the adapter has reached the maximum current.

11. The adapter of claim 10, wherein the power converting unit comprises a primary rectifying unit, a transformer, a secondary rectifying unit, and a secondary filter unit, and wherein the primary rectifying unit is configured to directly output a voltage of a pulsating waveform to the transformer.

12. The adapter of claim 11, wherein the maximum current that the adapter is able to output in the constant-voltage mode is determined based on capacity of one or more capacitors in the secondary filter unit.

13. The adapter of claim 1, wherein the adapter is operable in a second charging mode, the second charging mode being a constant-current mode, and in the constant-current mode, the target voltage is the maximum voltage that the adapter is able to output in the constant-current mode and the target current is a current corresponding to the constant-current mode; and the power adjusting unit is configured to adjust the output current of the adapter to the current corresponding to the constant-current mode based on the current feedback signal, and control the output voltage of the adapter to not exceed the maximum voltage that the adapter is able to output in the constant-current mode when the voltage feedback signal indicates the output voltage of the adapter has reached the maximum voltage.

14. The adapter of claim 1, wherein the adapter is operable in a first charging mode and a second charging mode, and a charging speed of the device to be charged by the adapter in the second charging mode is faster than a charging speed of the device to be charged by the adapter in the first charging mode, and wherein the adapter comprises a control unit that performs the two-way communication with the device to be charged to control an output of the adapter in the second charging mode, when the adapter is connected with the device to be charged.

15. The adapter of claim 14, wherein performing, by the control unit, the two-way communication with the device to be charged to control an adapter output in the second charging mode comprises:
    performing, by the control unit, the two-way communication with the device to be charged to negotiate a charging mode between the adapter and the device to be charged.

16. The adapter of claim 14, wherein performing by the control unit the two-way communication with the device to be charged to control the output of the adapter in the second charging mode comprises:
    performing, by the control unit, the two-way communication with the device to be charged to negotiate an output charging voltage of the adapter used to charge the device to be charged in the second charging mode; and
    adjusting, by the control unit, a value of the target voltage to be equal to the output charging voltage of the adapter used to charge the device to be charged in the second charging mode.

17. The adapter of claim 14, wherein performing by the control unit the two-way communication with the device to be charged to control the output of the adapter in the second charging mode comprises:
    performing, by the control unit, the two-way communication with the device to be charged to determine a charging current outputted by the adapter in the second charging mode and used to charge the device to be charged; and
    adjusting, by the control unit, a current value of the target current to be equal to the charging current outputted by the adapter in the second charging mode and is used to charge the device to be charged.

18. The adapter of claim 14, wherein performing, by the control unit, the two-way communication with the device to be charged to control the output of the adapter in the second charging mode comprises:
    performing, by the control unit, the two-way communication with the device to be charged to adjust the output current of the adapter during a charging process in the second charging mode.

19. A method for charging control implemented by an adapter, comprising:
    converting an input alternating current (AC) to obtain an output voltage and an output current of the adapter;
    detecting the output voltage of the adapter to generate a voltage feedback signal that indicates whether the output voltage of the adapter reaches a target voltage;
    detecting the output current of the adapter to generate a current feedback signal that indicates whether the output current of the adapter reaches a target current;
    stabilizing the output voltage and the output current of the adapter when the voltage feedback signal indicates the output voltage of the adapter has reached the target voltage or when the current feedback signal indicates the output current of the adapter has reached the target current; and
    performing two-way communication with a device to be charged via a data line in a charging interface;
    wherein detecting the output current of the adapter to generate the current feedback signal comprises:
        sampling the output current of the adapter to obtain a third voltage that indicates a magnitude of the output current of the adapter;
        dividing the third voltage according to a voltage division ratio to obtain a second voltage;
        comparing the second voltage against a second reference voltage;
        generating the current feedback signal based on comparison between the second voltage and the second reference voltage; and
    wherein the method further comprises:
        adjusting the voltage division ratio to adjust a value of the target current.

20. The method of claim 19, wherein detecting the output voltage of the adapter to generate the voltage feedback signal comprises:
    dividing the output voltage of the adapter according to a voltage division ratio to obtain a first voltage;
    comparing the first voltage against a first reference voltage;
    generating the voltage feedback signal based on comparison between the first voltage and the first reference voltage; and
    wherein the method further comprises:
        adjusting the voltage division ratio to adjust a value of the target voltage.

21. The method of claim 19, wherein the adapter is operable in a first charging mode and a second charging mode, and the method further comprises:
    adjusting a value of at least one of the target current or the target voltage, based on the first charging mode or the second charging mode currently used by the adapter.

22. The method of claim 19, wherein the adapter is operable in a first charging mode, the first charging mode being a constant-voltage mode, and in the constant-voltage mode, the target voltage is a voltage corresponding to the constant-voltage mode and the target current is the maximum current that the adapter is able to output under the constant-voltage mode, and wherein the method further comprises:
    adjusting the output voltage of the adapter to the voltage corresponding to the constant-voltage mode based on the voltage feedback signal, wherein stabilizing the output voltage and the output current of the adapter when the voltage feedback signal indicates the output voltage of the adapter has reached the target voltage or when the current feedback signal indicates the output current of the adapter has reached the target current comprises:
        controlling the output current of the adapter to not exceed the maximum current that the adapter is able to output under the constant-voltage mode, when the current feedback signal indicates the output current of the adapter has reached the maximum current allowed to output under the constant-voltage mode.

* * * * *